(12) United States Patent
Oda et al.

(10) Patent No.: US 8,969,173 B2
(45) Date of Patent: Mar. 3, 2015

(54) METHOD OF FABRICATING ELECTRONIC COMPONENT

(71) Applicant: Taiyo Yuden Co., Ltd., Tokyo (JP)

(72) Inventors: Yasuyuki Oda, Kanagawa (JP); Kaoru Sakinada, Kanagawa (JP); Takashi Miyagawa, Kanagawa (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 0 days.

(21) Appl. No.: 13/918,002

(22) Filed: Jun. 14, 2013

(65) Prior Publication Data

US 2013/0337610 A1 Dec. 19, 2013

(30) Foreign Application Priority Data

Jun. 18, 2012 (JP) ................................. 2012-137029
Oct. 19, 2012 (JP) ................................. 2012-231902

(51) Int. Cl.
  *H01L 21/46* (2006.01)
  *H01L 21/78* (2006.01)
(52) U.S. Cl.
  CPC ...................................... *H01L 21/78* (2013.01)
  USPC ......................................................... 438/458

(58) Field of Classification Search
  None
  See application file for complete search history.

(56) References Cited

U.S. PATENT DOCUMENTS

| 5,639,014 | A * | 6/1997 | Damiano et al. ............... 228/254 |
| 2004/0040856 | A1 * | 3/2004 | Hamano ....................... 205/123 |
| 2004/0222519 | A1 * | 11/2004 | Aoyagi ......................... 257/734 |
| 2006/0138672 | A1 | 6/2006 | Sakinada et al. |
| 2010/0066209 | A1 * | 3/2010 | Saitou et al. ................... 310/340 |
| 2011/0155443 | A1 * | 6/2011 | Maeda et al. .................. 174/267 |
| 2012/0280374 | A1 * | 11/2012 | Choi et al. ..................... 257/659 |

FOREIGN PATENT DOCUMENTS

| JP | 2006-203149 A | 8/2006 |
| JP | 2007-019942 A | 1/2007 |
| JP | 2009-272975 A | 11/2009 |

* cited by examiner

*Primary Examiner* — Zandra Smith
*Assistant Examiner* — Andre' C Stevenson
(74) *Attorney, Agent, or Firm* — Chen Yoshimura LLP

(57) ABSTRACT

A method of fabricating an electronic component includes: mounting a device chip on an upper surface of an insulative substrate; forming a sealing portion that seals the device chip; cutting the insulative substrate and the sealing portion; and forming a plated layer covering the sealing portion by barrel plating.

13 Claims, 24 Drawing Sheets

METHOD OF FABRICATING ELECTRONIC COMPONENT

CROSS-REFERENCE TO RELATED APPLICATION

This application is based upon and claims the benefit of priority of the prior Japanese Patent Application No. 2012-137029 filed on Jun. 18, 2012 and Japanese Patent Application No. 2012-231902 filed on Oct. 19, 2012, the entire contents of which are incorporated herein by reference.

FIELD

A certain aspect of the present invention relates to a method of fabricating an electronic component.

BACKGROUND

There has been used a technique that flip-chip mounts a device chip including a surface acoustic wave (SAW) filter or the like on an insulative substrate for packaging. The device chip is hermetically sealed to be protected from foreign matter and moisture. Japanese Patent Application Publication No. 2006-203149 discloses a technique that seals the device chip with solder.

However, the conventional technique has difficulty in downsizing an electronic component.

SUMMARY OF THE INVENTION

According to an aspect of the present invention, there is provided a method of fabricating an electronic component including: mounting a device chip on an upper surface of an insulative substrate; forming a sealing portion that seals the device chip; cutting the insulative substrate and the sealing portion; and forming a plated layer covering the sealing portion by barrel plating.

DETAILED DESCRIPTION

Figure 1A:
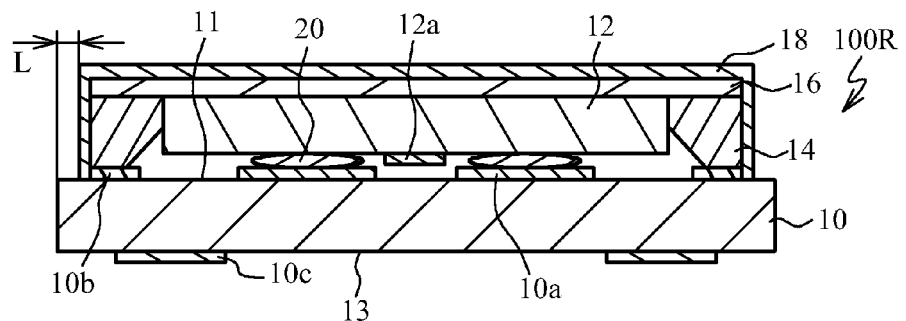
FIG. 1A is a cross-sectional view illustrating an electronic component in accordance with a first comparative example.

A description will first be given of a first comparative example. FIG. 1A is a cross-sectional view illustrating an electronic component 100R in accordance with the first comparative example.

As illustrated in FIG. 1A, the electronic component 100R includes an insulative substrate 10, a device chip 12, a sealing portion 14, a lid 16, and a plated layer 18. Terminals 10a and a terminal 10b are located on an upper surface (first principal surface) 11 of the insulative substrate 10, and terminals 10c are located on a bottom surface (second principal surface) 13 of the insulative substrate 10. The device chip 12 includes, for example, a SAW filter, and a surface of the device chip 12 facing the insulative substrate 10 includes an IDT (Interdigital Transducer: comb-shaped electrode) 12a formed thereon. That is to say, the device chip 12 is flip-chip mounted on the upper surface 11 with bumps 20 so that an air-space is formed between the IDT 12a and the upper surface 11. The lid 16 is located on the upper surface of the device chip 12. The sealing portion 14 located around the device chip 12 is electrically coupled to the terminal 10b, and contacts with a side surface of the device chip 12 and a bottom surface of the lid 16. The sealing portion 14 is located so as to surround the device chip 12, and the upper surface of the sealing portion 14 is located in the same plane as the upper surface of the device chip 12. The sealing portion 14 and the lid 16 hermetically seal the device chip 12 to protect the IDT 12a from foreign matter and moisture. The plated layer 18 covers the surfaces of the sealing portion 14 and the lid 16 to protect them.

The insulative substrate 10 is formed of an inorganic insulating material such as ceramic. The terminals 10a through 10c include a metal such as gold (Au). The terminals 10a are signal terminals that transmit/receive a signal to/from the device chip 12. The terminal 10b is a ground terminal. The terminals 10c include a signal terminal and a ground terminal. The terminals 10a are electrically coupled to the terminals 10c by wiring (not illustrated) in the insulative substrate 10, and the terminal 10b is electrically coupled to the terminals 10c by the wiring. The sealing portion 14 and the bumps 20 are formed of solder including, for example, tin silver (Sn—Ag). The lid 16 is formed of a metal such as kovar or an insulating material such as a resin. The plated layer 18 is formed of a metal such as nickel (Ni).

Figure 1B:
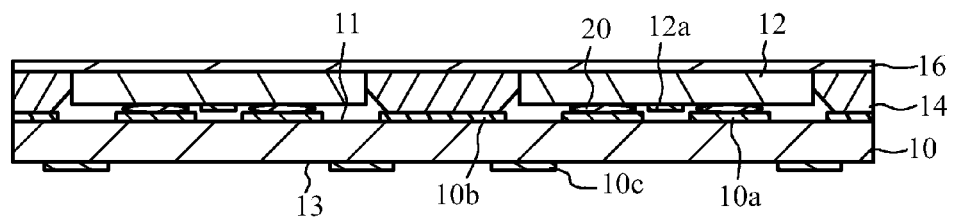
FIG. 1B through FIG. 1D are cross-sectional views illustrating a method of fabricating the electronic component.
Figure 1C:
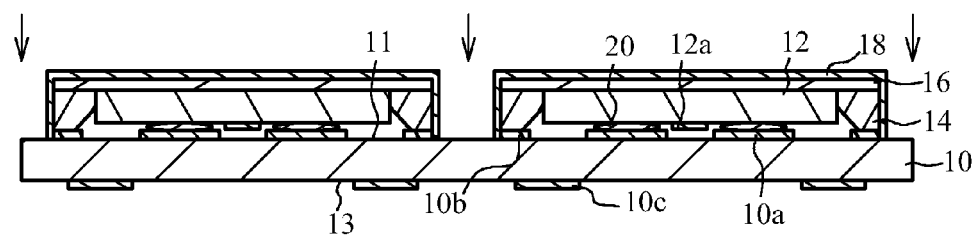
Figure 1D:
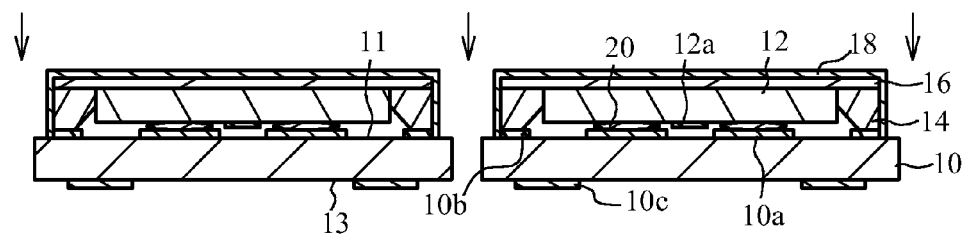

FIG. 1B through FIG. 1D are cross-sectional views illustrating a method of fabricating the electronic component 100R. As illustrated in FIG. 1B, two or more device chips 12 are flip-chip mounted on the upper surface 11 of the insulative substrate 10. Then, the device chips 12 are sealed by the sealing portion 14 and the lid 16. After that, a tape (not illustrated) is bonded to the bottom surface 13 of the insulative substrate 10. Next, half dicing (first dicing) is performed to cut the lid 16 and the sealing portion 14 from a side of the upper surface 11 of the insulative substrate 10 as indicated with an arrow in FIG. 1C. This process forms sidewalls made of the sealing portion 14 on the side surfaces of the device chips 12. The sealing portion 14 is formed so as to surround the side surfaces of the device chips 12. Then, the plated layer 18 covering the sidewalls of the sealing portions 14 through the upper surface of the lid 16 is formed by electrolytic plating. After that, full dicing (second dicing) is performed to cut the insulative substrate 10 from the side of the upper surface 11 as indicated with an arrow in FIG. 1D. This process forms individual electronic components 100R.

The above described fabrication process is required to secure a clearance between a dicing line in the half dicing and a dicing line in the full dicing. For example, a width of the dicing line in the full dicing is less than a width of the dicing line in the half dicing. Therefore, as illustrated in FIG. 1A, a clearance L is formed from the edge portion of the insulative substrate 10 to the plated layer 18. Thus, the electronic component 100R is difficult to downsize. In addition, after the half dicing, the electronic components are interconnected through the insulative substrate 10. That is to say, the electronic components are detached from each other on the insulative substrate 10, and the electronic component 100R is likely to be damaged, for example the insulative substrate 10 may crack when handled. Thickening the insulative substrate 10 prevents the damage. However, when the insulative substrate 10 is thickened, the height of the electronic component 100R becomes difficult to reduce.

In addition, the position gap between the dicing lines in the half dicing and the full dicing causes the plated layer 18 to be cut in the full dicing, for example. This causes the plated layer 18 to insufficiently protect the sealing portion 14 and the lid 16. Moreover, a mark indicating a position (not illustrated) is sometimes put on the bottom surface 13 of the insulative substrate 10. The process that performs the half dicing and the full dicing based on the mark is sometimes employed. However, the half dicing and the full dicing are performed from the side of the upper surface 11 of the insulative substrate 10, and thus the position of the terminal 10c on the bottom surface 13 is difficult to confirm. Therefore, the terminal 10c may be shifted from a desired position in the electronic component 100R. That is to say, the terminal 10c may fail to be located in a given position corresponding to an outer shape of the electronic component 100R. A description will next be given of the first embodiment.

First Embodiment

A first embodiment of the present invention mounts two or more device chips 12 on the large-size insulative substrate 10, forms the sealing portion 14 that fills up the gap between the device chips 12, locates the lid 16 on the upper surfaces of the device chips 12 and sealing portion 14 as illustrated in FIG. 1B, and then cuts the lid 16, the sealing portion 14, and the insulative substrate 10 in the thickness direction by one time dicing. Then, plated are the surfaces of the sealing portion 14 and lid 16 in each of the device chips 12 on the individual insulative substrates 10 separated by the dicing. FIG. 2A through FIG. 3A are cross-sectional views illustrating a method of fabricating an electronic component 100 of the first embodiment. FIG. 3B is a cross-sectional view illustrating the electronic component 100 fabricated through the process illustrated in FIG. 2A through FIG. 3A. As with the first comparative example, the device chips 12 are sealed (see FIG. 1B).

Figure 2A:
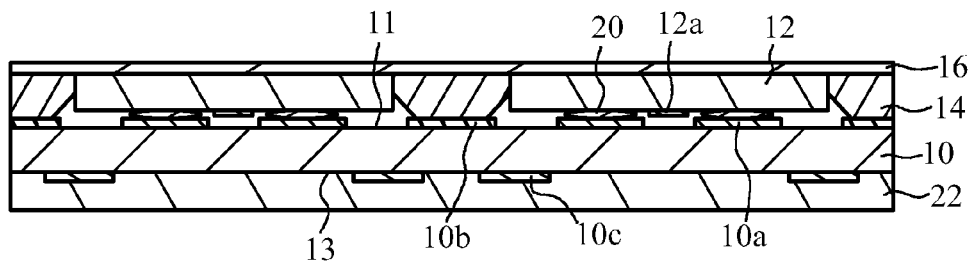
FIG. 2A through FIG. 2C are cross-sectional views illustrating a method of fabricating an electronic component in accordance with a first embodiment.
Figure 2B:
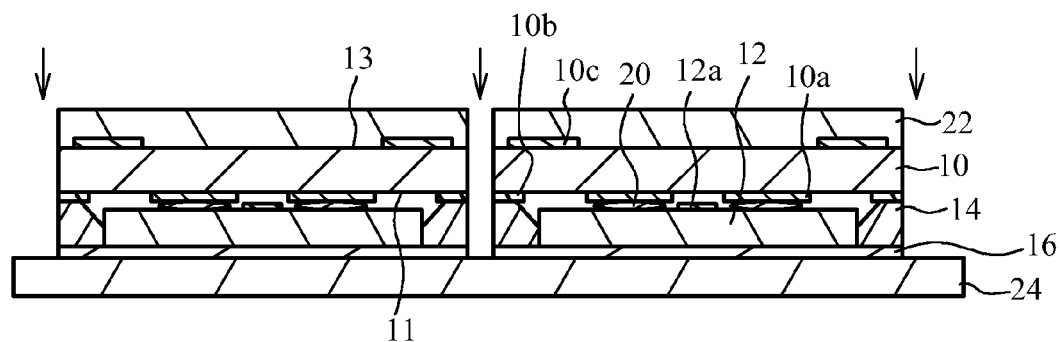

The present embodiment forms a resist layer 22 on the bottom surface 13 of the insulative substrate 10 as illustrated in FIG. 2A. The resist layer 22 is formed on the whole of the bottom surface 13 of the insulative substrate 10, and covers the terminals 10c. Then, as illustrated in FIG. 2B, a film (dicing tape) 24 is bonded to the lid 16, and the insulative substrate 10, the sealing portion 14, and the lid 16 are sequentially cut and separated in the thickness direction from the resist layer 22 side. This process separates the electronic components including the insulative substrate 10 into individual electronic components. This cutting and separating process is referred to as full dicing. Then, the film 24 is removed from the lid 16. This process allows the electronic components to be handled separately (individually) in a latter process.

Figure 2C:
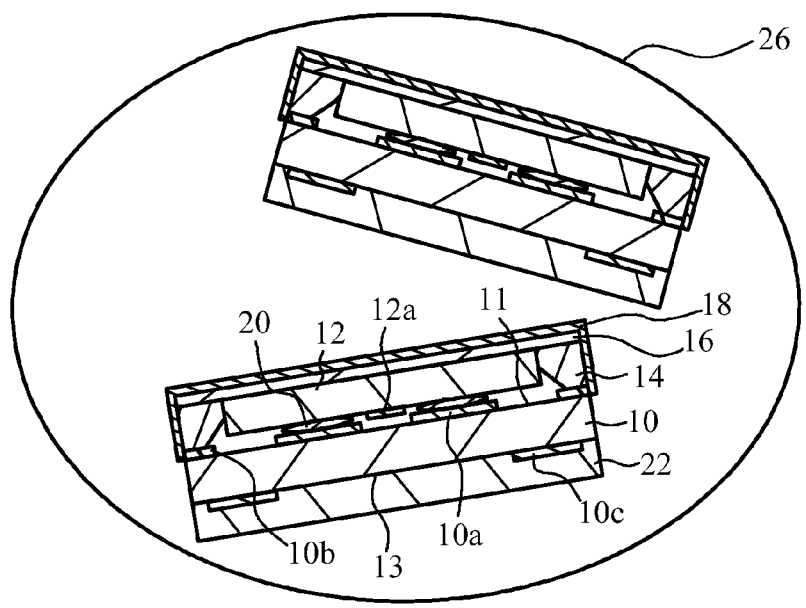
Figure 3A:
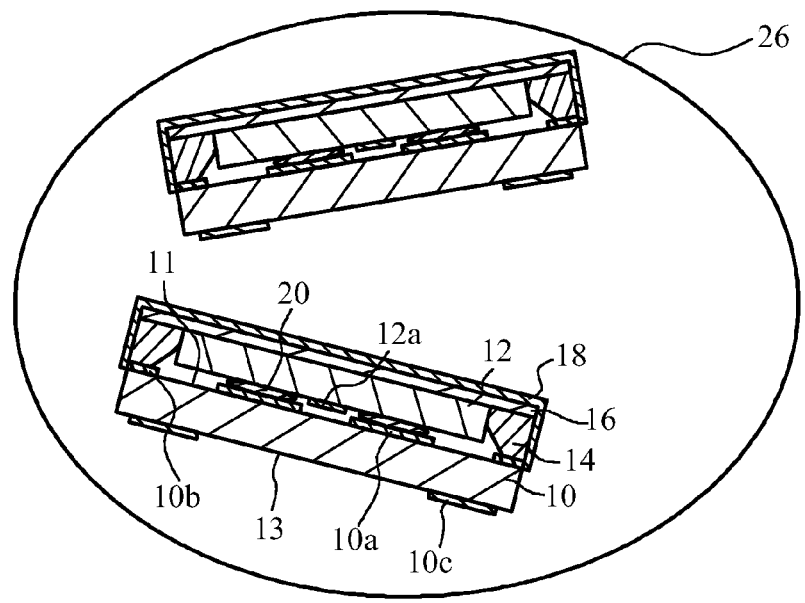
FIG. 3A is a cross-sectional view illustrating a method of fabricating the electronic component.
Figure 3B:
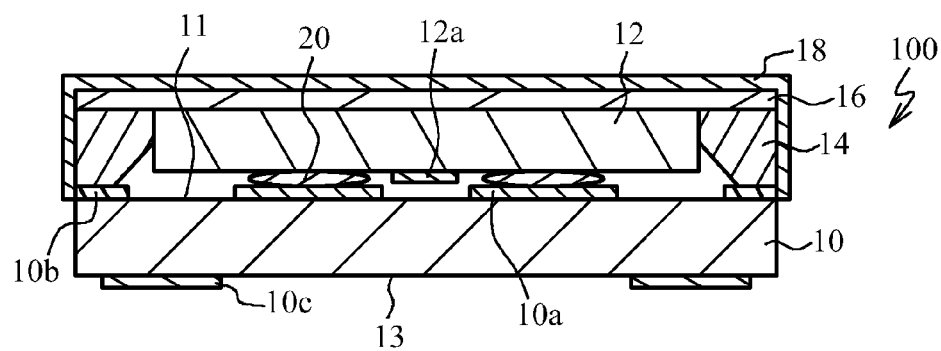
FIG. 3B is a cross-sectional view illustrating the electronic component.

The present embodiment puts the individually separated electronic components into a barrel 26 as illustrated in FIG. 2C. The barrel 26 is a container made with a porous member, and rotates with keeping the electronic components inside thereof and allowing the fluid to flow in and flow out. A plating bathtub (not illustrated) in which the barrel 26 is located reserves a plating solution such as a nickel sulfamate solution with a concentration of, for example, 350 to 550 g/l. The barrel 26 is rotated and a current is applied in the barrel 26. That is to say, the nickel (Ni) plated layer 18 is formed on the exposed surfaces of the sealing portion 14 and lid 16 by electrolytic barrel plating, which is electrolytic plating with the barrel 26 under constant current control. The plated layer 18 is formed so as to cover the surfaces of the sealing portion 14 and lid 16. The plated layer 18 has a thickness of, for example, 5 μm. Then, the resist layer 22 is removed by immersing the barrel 26 in a processing vessel (not illustrated) containing organic solvents and rotating the barrel 26 as illustrated in FIG. 3A. The above described process forms the electronic component 100 illustrated in FIG. 3B. FIG. 2C and FIG. 3A, and FIG. 6B, FIG. 7A, FIG. 7B, FIG. 10A, FIG. 10B, FIG. 11A, FIG. 13A, and FIG. 13B described later omit reference numerals for the electronic component illustrated in the upper area in the barrel 26, but the electronic component has the same structure as the electronic component illustrated in the lower area in the barrel.

The first embodiment sequentially cuts and separates the insulative substrate 10, the sealing portion 14, and the lid 16 in their thickness direction. Therefore, the electronic component is not handled in a state where the insulative substrate 10, the sealing portion 14, and the lid 16 are thin, and the damage to the electronic component 100 in the fabrication process can be prevented or suppressed. Accordingly, thickening the insulative substrate is not necessary, and the height of the electronic component 100 can be easily reduced. In addition, the dicing is performed once, and thus alignment between dicing lines is not necessary between two or more dicing processes. That is to say, it becomes possible to perform full dicing while confirming a position of the terminal 10c by putting a mark indicating the position on the bottom surface 13 of the insulative substrate 10 and cutting the substrate from the bottom surface 13. This effectively suppresses positional misalignment of the terminal 10c. In addition, securing a clearance is not necessary in dicing, and thus the electronic component 100 can be downsized. Necessary plated layer 18 can be formed on preliminarily individually separated electronic components 100 by electrolytic barrel plating. Moreover, the rotation of the barrel 26 removes (chamfers) sharp edges of the insulative substrate 10, and thus the insulative substrate 10 can be prevented from cracking.

Figure 4A:
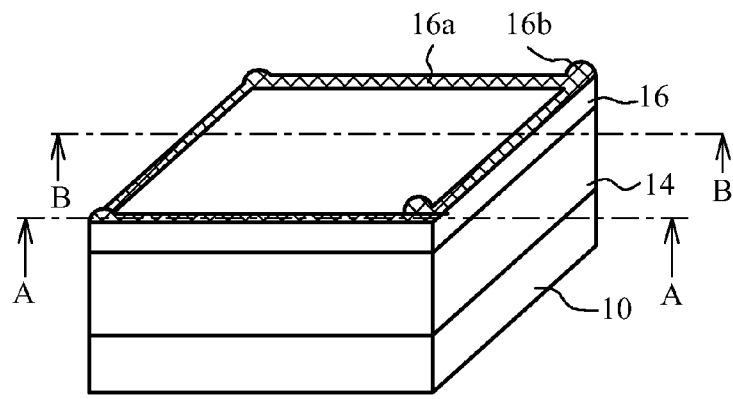
FIG. 4A is a perspective view illustrating a state where burrs are formed.
Figure 4B:
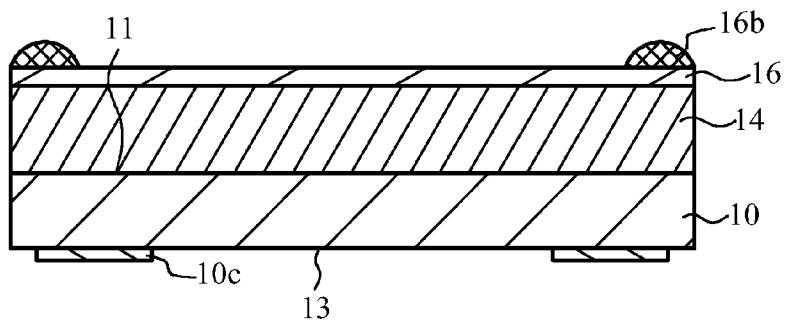
FIG. 4B is a cross-sectional view taken along line A-A in FIG. 4A.
Figure 4C:
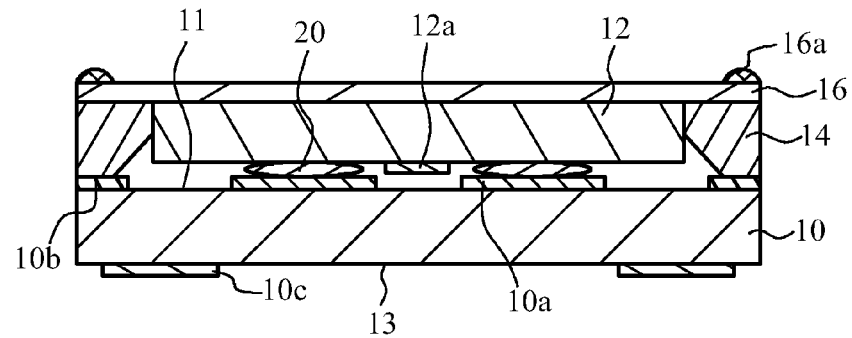
FIG. 4C is a cross-sectional view taken along line B-B in FIG. 4A.

A bun is sometimes formed in the lid 16 in full dicing although it is not illustrated in the fabrication process illustrated in FIG. 1A through FIG. 3B. FIG. 4A is a perspective view illustrating a state where burrs 16a and 16b are formed in the lid 16. FIG. 4B is a cross-sectional view taken along line A-A in FIG. 4A. That is to say, it is a cross-sectional view taken along an edge portion of one side surface of the electronic component 100. FIG. 4C is a cross-sectional view taken along line B-B in FIG. 4A. That is to say, it is a cross-section taken along an almost center part of the electronic component 100. The resist layer 22 is not illustrated.

As indicated with cross-hatching in FIG. 4A through FIG. 4C, the burrs 16a and 16b are formed and protrude from the upper surface of the lid 16. In the full dicing, the burrs 16b formed at four corners of the lid 16 tend to protrude more than the burrs 16a formed along edge portions of four sides of the lid 16.

Such burrs 16a and 16b are easily removed during electrolytic barrel plating. This is because the electronic components 100 move and contact with each other during electrolytic barrel plating, and trim the contacting parts therebetween. Especially, the burrs 16b formed at four corners of the lid 16 are easily removed because of their formed positions and shapes.

Figure 5A:
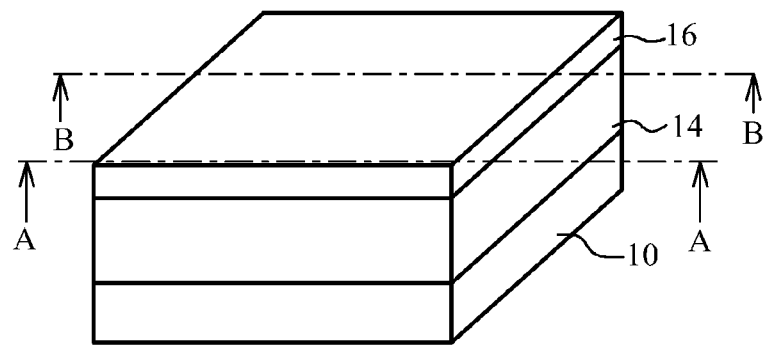
FIG. 5A is a perspective view illustrating a state where burrs are removed.
Figure 5B:
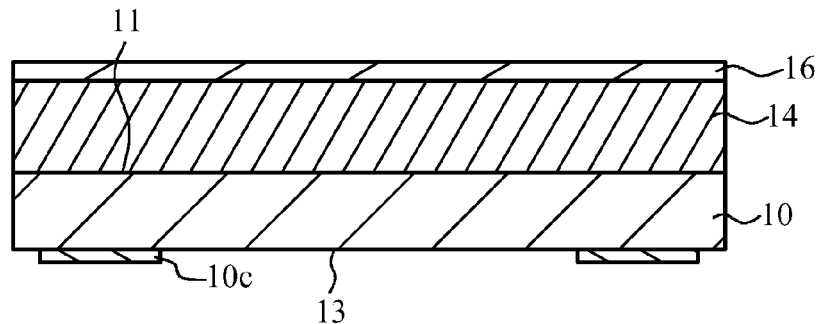
FIG. 5B is a cross-sectional view taken along line A-A in FIG. 5A.
Figure 5C:
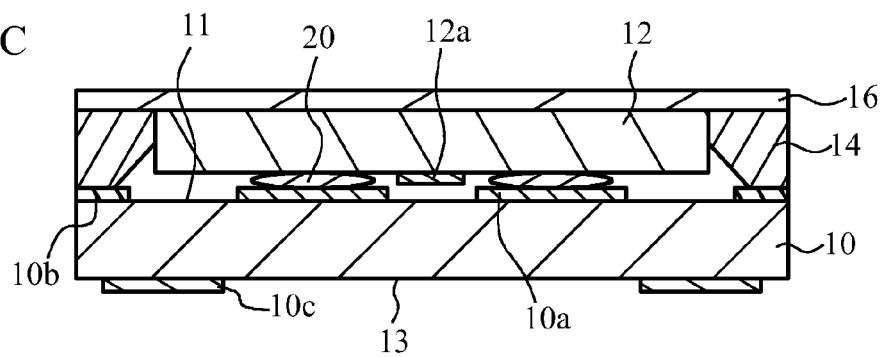
FIG. 5C is a cross-sectional view taken along line B-B in FIG. 5A.

FIG. 5A is a perspective view illustrating a state where the burrs 16a and 16b are removed. FIG. 5B is a cross-sectional view taken along line A-A in FIG. 5A, and corresponds to the cross-section taken along line A-A in FIG. 4A. FIG. 5C is a cross-sectional view taken along line B-B in FIG. 5A, and corresponds to the cross-section taken along line B-B in FIG. 4A. As illustrated in FIG. 5A through FIG. 5C, the burrs 16a and 16b are removed during electrolytic barrel plating. Thus, the plated layer 18 is formed on the surface of the lid 16 and the exposed surface of the sealing portion 14, with the burrs 16a and 16b being removed as illustrated in FIG. 5C. Therefore, the electronic component 100 is not thickened. That is to say, the height of the electronic component 100 can be further reduced.

As illustrated in FIG. 2A, the resist layer 22 is formed so as to cover the terminals 10c on the bottom surface 13 of the insulative substrate 10 before electrolytic barrel plating. Thus, the terminals 10c in a certain electronic component 100 are prevented from contacting with the plated layer 18 of another electronic component 100. Moreover, the sealing portion 14 includes a metal, and thus the plated layer 18 is formed on the exposed side surface of the sealing portion 14 by electrolytic barrel plating. In contrast, the plated layer 18 is not formed on the exposed surface of the insulative substrate 10. That is to say, the plated layer 18 is selectively formed in a desired part and region in the electronic component 100 by electrolytic barrel plating. In addition, the plated layer 18 with a uniform thickness can be efficiently formed.

As described previously, the side surface of the device chip 12 is covered with the sealing portion 14, and the back surface thereof (back surface of the surface on which the IDT is formed) is covered with the lid 16 located on the back surface. That is to say, the device chip 12 is hermetically sealed by the sealing portion 14 and the lid 16. In addition, the plated layer 18 formed on the surfaces of the lid 16 and sealing portion 14 is continuously formed, and thus the damage to the sealing portion 14 is suppressed. For example, the lid 16 can prevent the sealing portion 14 from deforming because of application of heat in reflow process. Therefore, the device chip 12 can be protected more effectively.

Second Embodiment

Figure 6A:
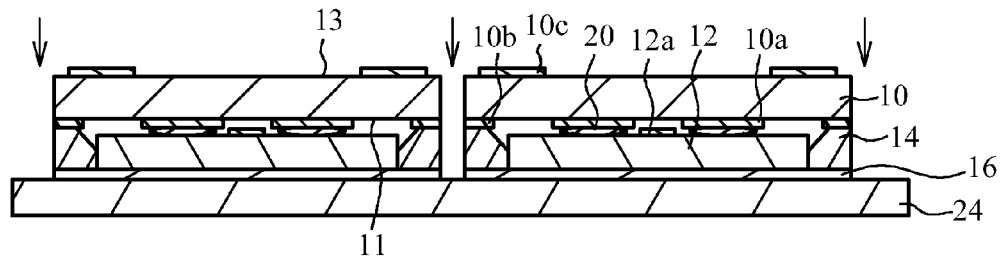
FIG. 6A and FIG. 6B are cross-sectional views illustrating a method of fabricating an electronic component in accordance with a second embodiment.
Figure 6B:
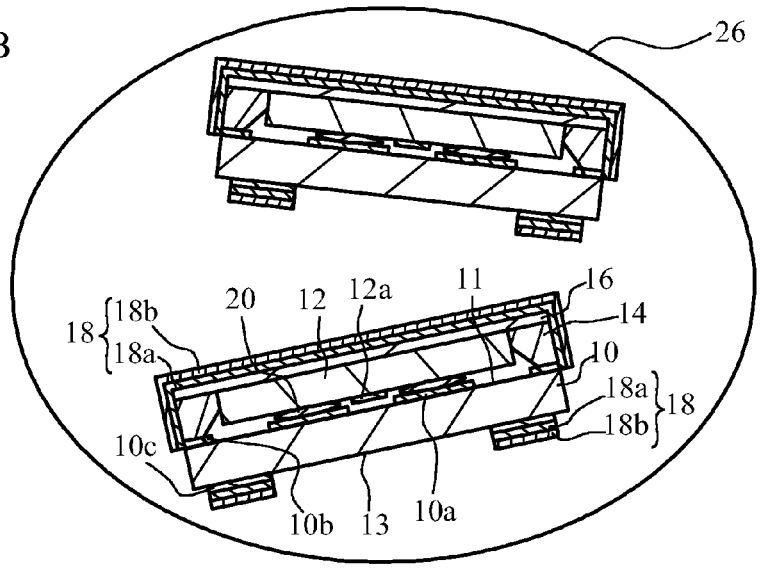
Figure 6C:
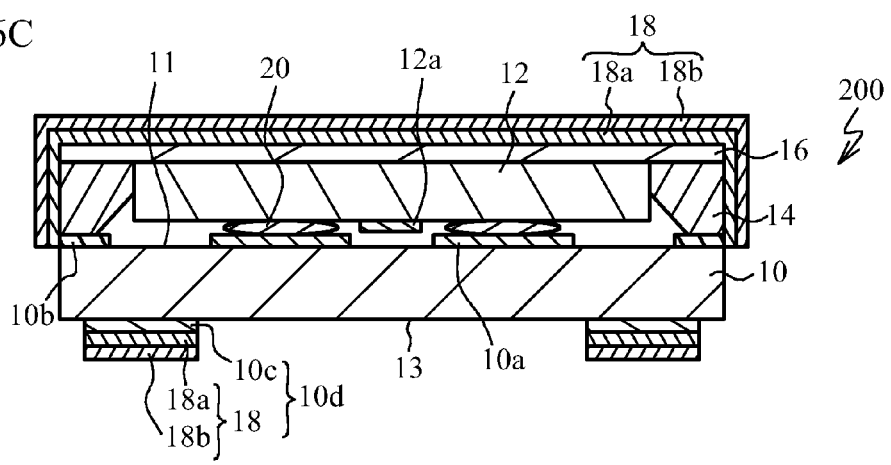
FIG. 6C is a cross-sectional view illustrating the electronic component.

A second embodiment forms the plated layer 18 on the exposed surfaces of the sealing portion 14 and lid 16, and also forms the plated layer 18 on the terminals 10c located on the bottom surface 13 of the insulative substrate 10. FIG. 6A and FIG. 6B are cross-sectional views illustrating a method of fabricating an electronic component 200 in accordance with the second embodiment. FIG. 6C is a cross-sectional view illustrating the electronic component 200.

As illustrated in FIG. 6A, the present embodiment performs full dicing without forming the resist layer 22 on the second principal surface (bottom surface 13) of the insulative substrate 10. Then, as illustrated in FIG. 6B, the plated layer 18 is formed by electrolytic barrel plating under a state where the terminals 10c are exposed to the bottom surface 13. The plated layer 18 includes a Ni layer 18a and a Au layer 18b. The Ni layer 18a is formed before the Au layer 18b is formed. Thus, the Ni layer 18a contacts with the sealing portion 14, the lid 16, and the terminals 10c. The Au layer 18b covers the Ni layer 18a, and forms a surface of the plated layer 18. The above described process forms the electronic component 200 illustrated in FIG. 6C.

As illustrated in FIG. 6C, in the electronic component 200, the plated layer 18 is also formed on the surfaces of the terminals 10c on the bottom surface 13 of the insulative substrate 10. The terminal 10c and the plated layer 18 formed on the surface of the terminal 10c act as a terminal 10d for external connection of the electronic component 200. A lowermost layer of the terminal 10d is the Au layer 18b, and is formed of the same material as the terminal 10c. Therefore, the terminal 10d has the same function as the terminal 10c. FIG. 6B and FIG. 6C do not illustrate the Ni layer 18a or the Au layer 18b on the side surface of the terminal 10c, but the plated layer 18 including the above described two metal layers is formed on the side surface of the terminal 10c. The fabrication process of the second embodiment does not include the process that forms and removes the resist layer 22 on and from the bottom surface 13 of the insulative substrate 10. Therefore, the fabrication process can be simplified. As with the first embodiment, the electronic component 200 can be downsized and reduced in height, positional misalignment of the terminal 10c can be reduced, and damage to the sealing portion 14 can be prevented or suppressed. The plated layer 18 has only to include the same material as the terminal 10c. The lowermost layer of the plated layer 18 is preferably formed of the same material as the terminal 10c.

Third Embodiment

Figure 7A:
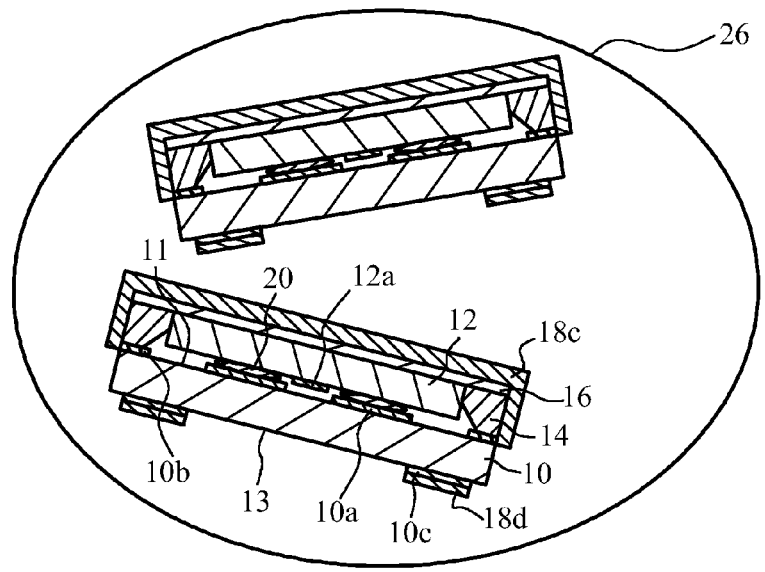
FIG. 7A and FIG. 7B are cross-sectional views illustrating a method of fabricating an electronic component in accordance with a third embodiment.
Figure 7B:
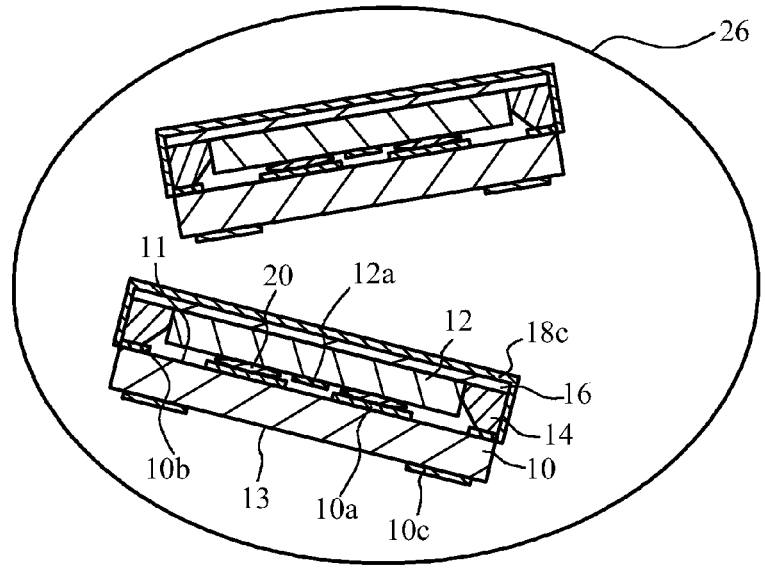
Figure 8:
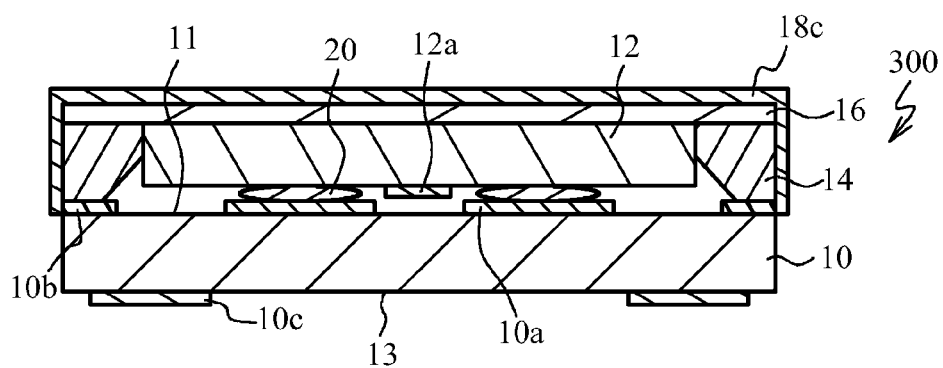
FIG. 8 is a cross-sectional view illustrating the electronic component.

The third embodiment includes the process that selectively forms the plated layer 18 so that the plated layer 18 has different thicknesses, or selectively leaves the plated layer 18. FIG. 7A and FIG. 7B are cross-sectional views illustrating a method of fabricating an electronic component 300 in accordance with the third embodiment. FIG. 8 is a cross-sectional view illustrating the electronic component 300.

As with the second embodiment, the third embodiment also performs full dicing without forming the resist layer 22 on the bottom surface 13 of the insulative substrate 10. As illustrated in FIG. 7A, a plated layer 18c and a plated layer 18d made of Ni are selectively formed by electrolytic barrel plating. That is to say, the plated layer 18c (first plated layer) is formed on the surfaces of the sealing portion 14 and lid 16. While the plated layer 18d (second plated layer) is formed on the surfaces of the terminals 10c on the bottom surface 13 of the insulative substrate 10. Conducting efficiency in the sealing portion 14 and the lid 16 is greater than conducting efficiency in the terminal 10c. Therefore, the sealing portion 14 and the lid 16 are electrolytic barrel plated faster than the terminal 10c. Thereby, the plated layer 18c is formed to be thicker than the plated layer 18d.

As illustrated in FIG. 7B, after electrolytic barrel plating, the barrel 26 is immersed in a processing vessel (not illustrated) containing an etching liquid made of nitric acid ($HNO_3$) and then rotated. The barrel etching removes the plated layer 18d formed on the surfaces of the terminals 10c on the bottom surface 13 of the insulative substrate 10, and exposes the terminals 10c. On the other hand, the plated layer 18c is thicker than the plated layer 18d, and thus remains after the barrel etching. The above described process forms the electronic component 300 illustrated in FIG. 8. As described above, the plated layer 18c can be selectively formed in a given part and region by selectively forming the plated layer 18c and the plated layer 18d so that they have different thicknesses using the difference in conducting efficiency between the sealing portion 14 and lid 16 and the terminal 10c, and then barrel etching the formed plated layers 18c and 18d.

As with the first embodiment, the third embodiment can reduce the size and height of the electronic component 200, reduce positional misalignment, and prevent damage. In addition, as with the second embodiment, the fabrication process can be simplified because the process that forms the resist layer 22 and the process that removes the resist layer 22 are not necessary. To thicken the plated layer 18c, the sealing portion 14 and the lid 16 preferably include a metal. To reduce the thickness of the plated layer 18c and remove the plated layer 18d by etching, the plated layers 18c and 18d are preferably formed of a material that differs from that of the terminal 10c and, especially, has etching selectivity.

Fourth Embodiment

Figure 10A:
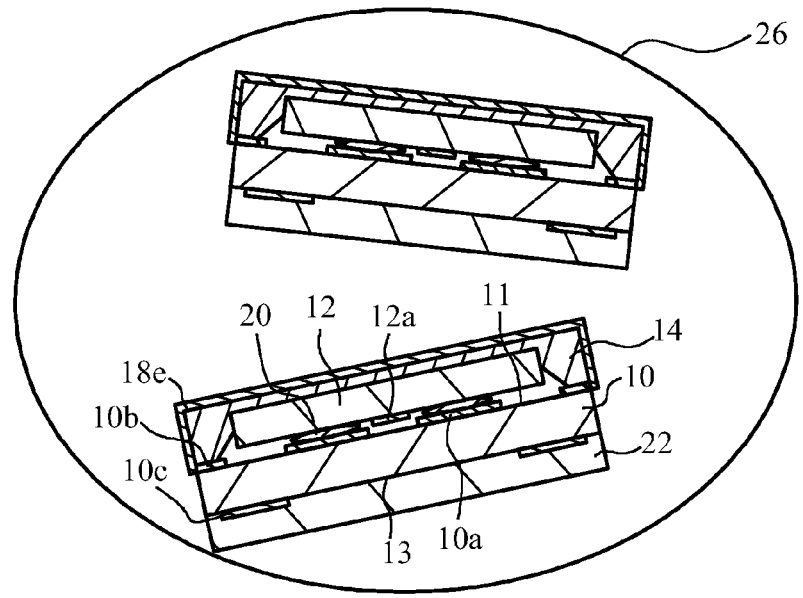
FIG. 10A and FIG. 10B are cross-sectional views illustrating a method of fabricating an electronic component.
Figure 10B:
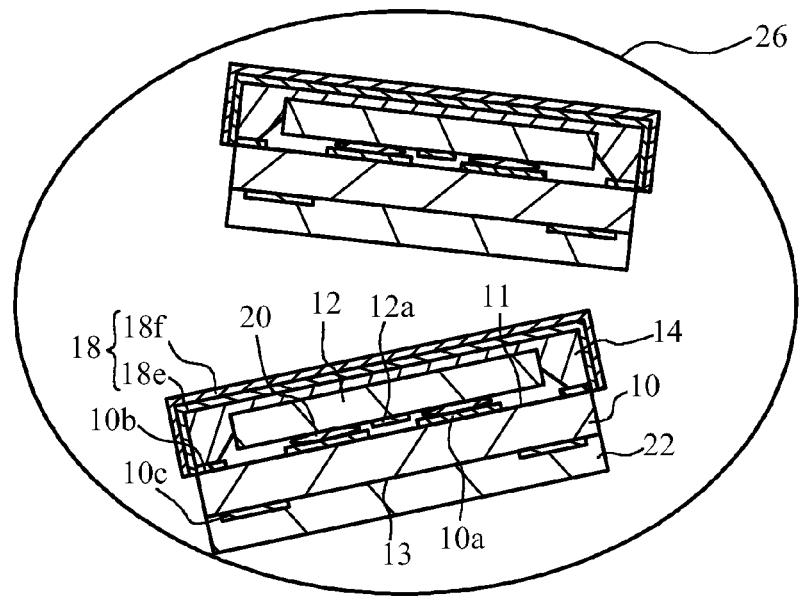
Figure 11A:
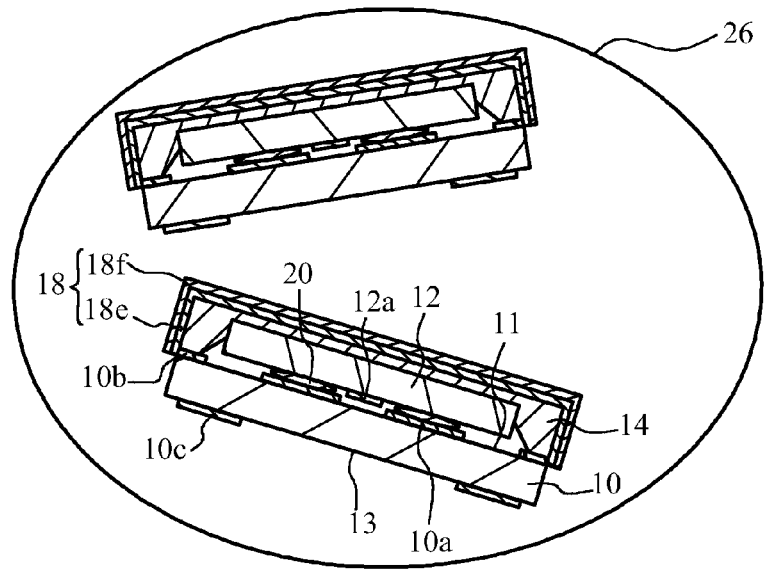
FIG. 11A is a cross-sectional view illustrating a method of fabricating an electronic component.
Figure 11B:
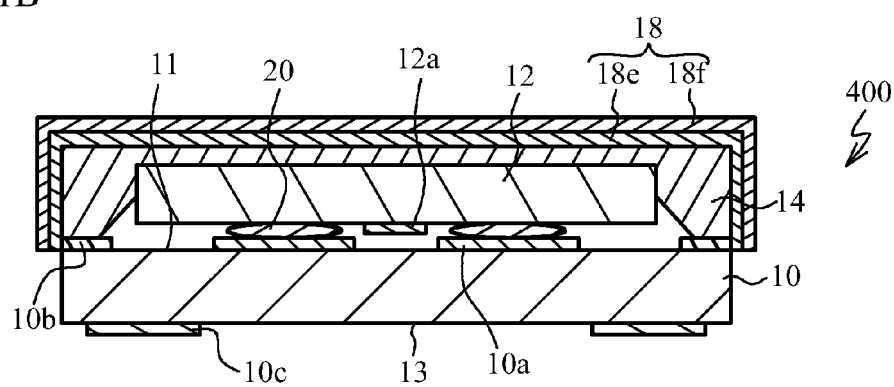
FIG. 11B is a cross-sectional view illustrating the electronic component.

A fourth embodiment forms the sealing portion 14 with an insulating material. FIG. 9A through FIG. 11A are cross-sectional views illustrating a method of fabricating an electronic component 400 in accordance with the fourth embodiment. FIG. 11B is a cross-sectional view illustrating the electronic component 400.

Figure 9A:
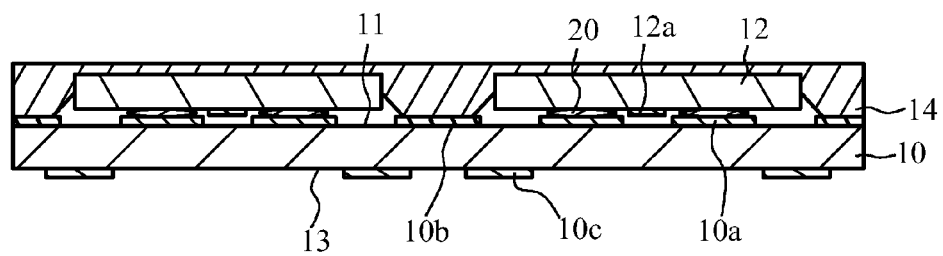
FIG. 9A through FIG. 9C are cross-sectional views illustrating a method of fabricating an electronic component in accordance with a fourth embodiment.
Figure 9B:
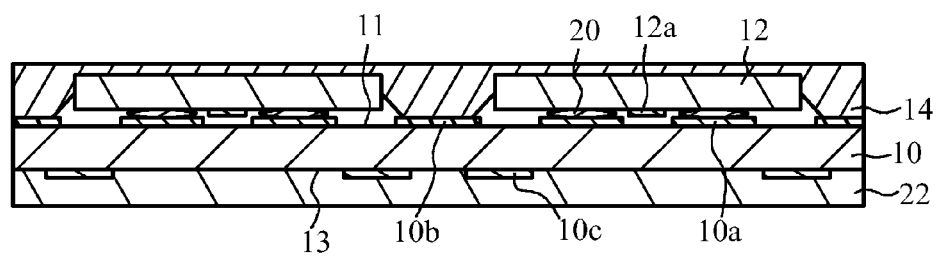
Figure 9C:
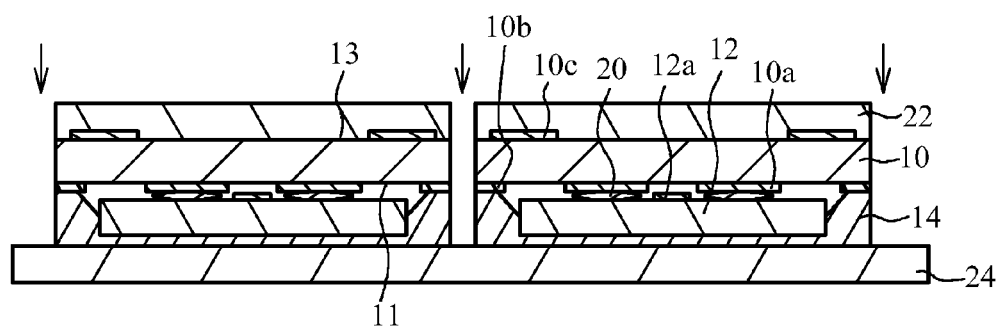

The present embodiment collectively seals two or more device chip 12 located away from each other on the upper surface 11 of the insulative substrate 10 with the sealing portion 14 as illustrated in FIG. 9A. The sealing portion 14 is formed of an insulative material such as an epoxy resin, covers the upper surfaces of the device chips 12 and the side surfaces of the device chips 12, and its tip arrives at the terminal 10b. The lid 16 is not located on the sealing portion 14. As illustrated in FIG. 9B, the resist layer 22 is formed on the bottom surface 13 of the insulative substrate 10. After the film 24 is bonded to the sealing portion 14, the insulative substrate 10 and the sealing portion 14 are sequentially cut and separated from the resist layer 22 side in their thickness direction.

Then, the plated layer 18 is formed on the exposed surface of the sealing portion 14. That is to say, as illustrated in FIG. 10A, a plated layer 18e (third plated layer) is selectively formed on the sealing portion 14 by electroless barrel plating the electronic components contained in the barrel 26 using, for example, palladium (Pd) as a catalyst. The plated layer 18e covers the surface of the sealing portion 14, but is not formed on the surface of the insulative substrate 10. An acid electroless nickel plating solution, nickel-phosphorus (Ni—P) alloy plating solution, or neutral electroless nickel-boron (Ni—B) alloy plating solution may be used as a plating solution. As illustrated in FIG. 10B, a plated layer 18f (fourth plated layer) is formed on the plated layer 18e by electrolytic barrel plating. The plated layer 18e functions as a seed metal for electrolytic plating. Thus, the plated layer 18f contacts with the plated layer 18e, and covers the surface of the plated layer 18e. The plated layer 18f is not formed on the surface of the insulative substrate 10. The plated layer 18e and the plated layer 18f are formed of a metal such as Ni. The plated layer 18e and the plated layer 18f function as the plated layer 18. As illustrated in FIG. 11A, after plating, the barrel 26 is immersed in a processing vessel (not illustrated) containing organic solvents to remove the resist layer 22. The above described process forms the electronic component 400 illustrated in FIG. 11B.

The fourth embodiment can perform electrolytic barrel plating using the plated layer 18e as a seed metal even when the sealing portion 14 is made of an insulating material. As with the first embodiment, the electronic component 400 can be downsized and reduced in height, positional misalignment can be reduced, and damage can be suppressed.

To form the plated layer 18 covering the surface of the sealing portion 14, the plated layer 18e is formed on the surface of the sealing portion 14 first. The plated layer 18e is not formed on the surface of the insulative substrate 10. This is to prevent a short circuit between the sealing portion 14 and the terminal 10c of the insulative substrate 10. An area in which the plated layer 18e is to be formed can be limited by using a catalyst such as Pd and properly selecting a type of the plating solution. For example, the insulative substrate 10 is formed of ceramic, the sealing portion 14 is formed of a resin such as an epoxy resin, and an acid electroless nickel plating solution, Ni—P alloy plating solution, or neutral electroless Ni—B alloy plating solution is used as a plating solution. The material may be other than the above described ones, and the insulative substrate 10 is preferably made of a material different from the material of the sealing portion 14.

Fifth Embodiment

A fifth embodiment forms the sealing portion 14 further thinner than those of the first through fourth embodiments. FIG. 12A through FIG. 13B are cross-sectional views illustrating a method of fabricating an electronic component 500 in accordance with the fifth embodiment. FIG. 14 is a cross-sectional view illustrating the electronic component 500.

Figure 12A:
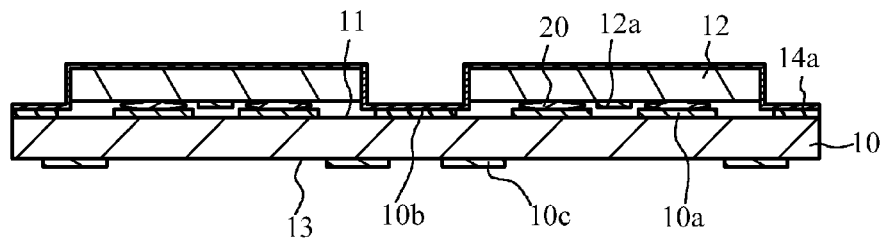
FIG. 12A through FIG. 12D are cross-sectional views illustrating a method of fabricating an electronic component in accordance with a fifth embodiment.
Figure 12B:
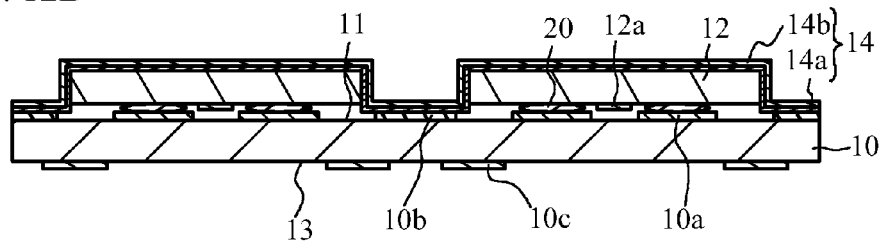
Figure 12C:
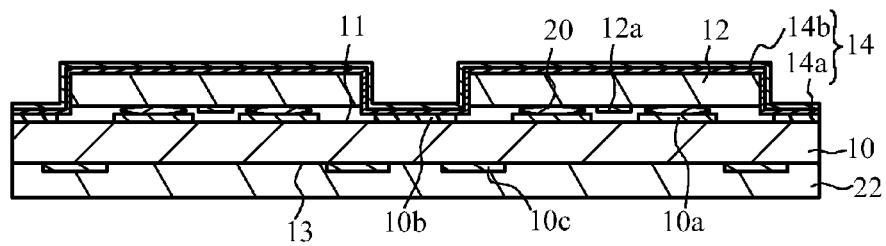
Figure 12D:
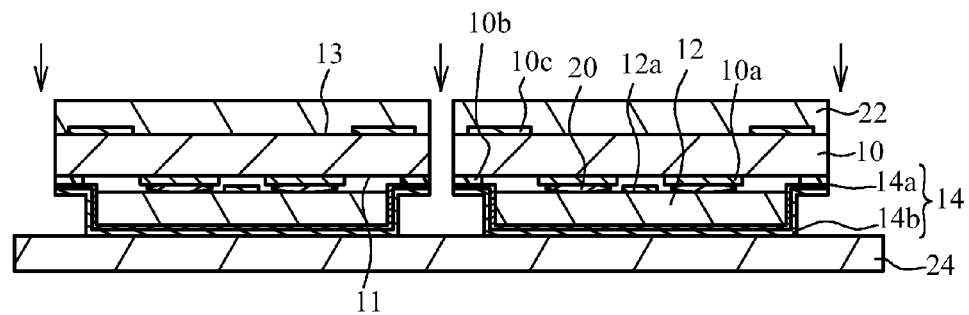

As illustrated in FIG. 12A, the present embodiment forms a resin layer 14a along the upper surfaces and side surfaces of two or more device chips 12 located away from each other on the upper surface 11 of the insulative substrate 10. The resin layer 14a is formed of a resin such as a thermostable polymer resin with a thickness of 10 to 20 μm, and covers and contacts with the upper surface of the terminal 10b and the side surfaces and upper surfaces of the device chips 12. Then, as illustrated in FIG. 12B, a metal layer 14b that contacts with the resin layer 14a and covers the surface of the resin layer 14a is formed by sputtering. The metal layer 14b is formed of a metal such as copper (Cu) with a thickness of 10 to 20 μm. The resin layer 14a and the metal layer 14b form the sealing portion 14. Then, as illustrated in FIG. 12C, the resist layer 22 is formed on the bottom surface 13 of the insulative substrate 10. As illustrated in FIG. 12D, the film 24 is bonded to the sealing portion 14, and then full dicing is performed from the bottom surface 13 side. That is to say, the insulative substrate 10 and the sealing portion 14 are sequentially cut and separated from the resist layer 22 side in their thickness direction.

Figure 13A:
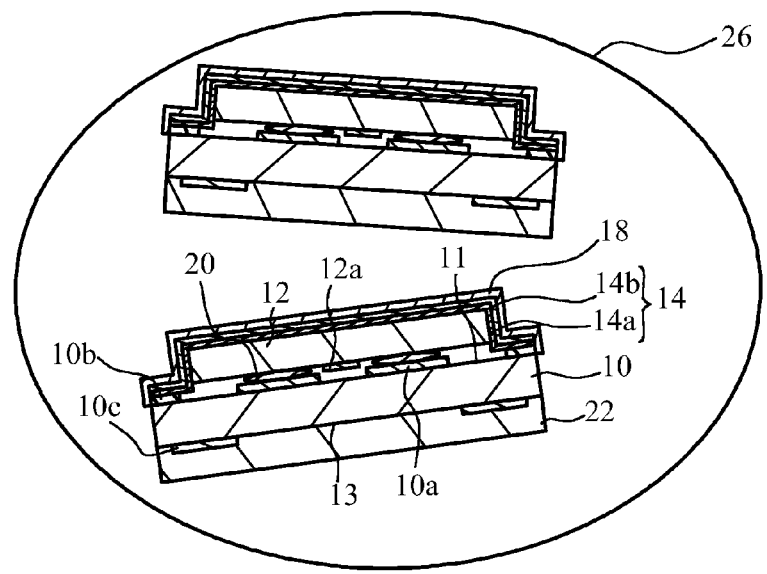
FIG. 13A and FIG. 13B are cross-sectional views illustrating a method of fabricating an electronic component.
Figure 13B:
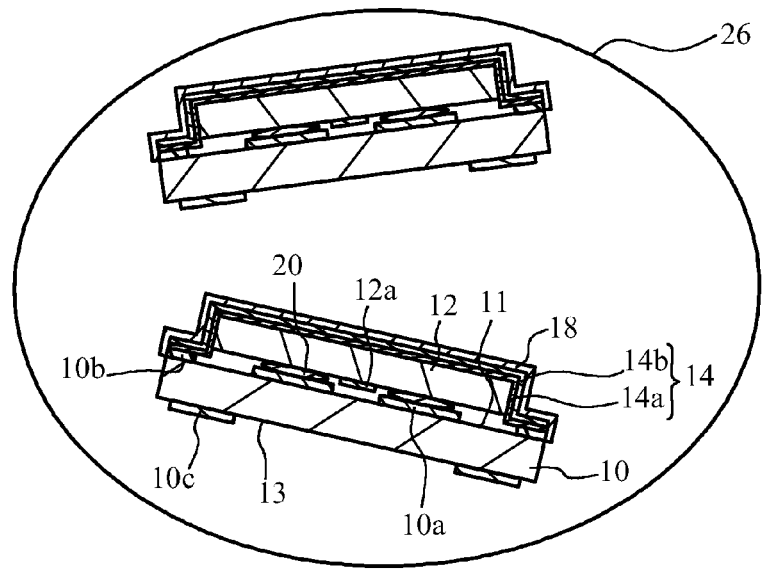
Figure 14:
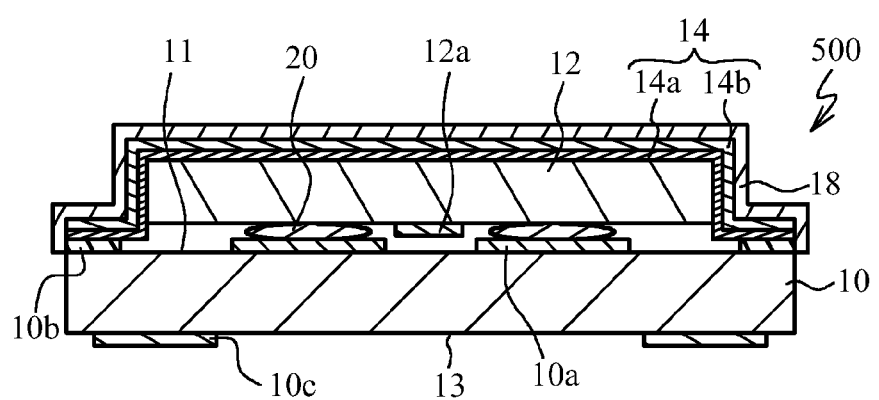
FIG. 14 is a cross-sectional view illustrating the electronic component.

As illustrated in FIG. 13A, the plated layer 18 is then formed on the surface of the metal layer 14b by electrolytic barrel plating. The plated layer 18 is formed of a metal such as Ni with a thickness of 10 μm for example, and contacts with the side surface of the terminal 10b. After the plating, as illustrated in FIG. 13B, the barrel 26 is immersed in a processing vessel (not illustrated) containing organic solvents to remove the resist layer 22. The above described process forms the electronic component 500 illustrated in FIG. 14.

The sealing portion 14 is formed from the resin layer 14a formed along the side surface and upper surface of the device chip 12, the metal layer 14b formed on the surface of the resin layer 14a, and the plated layer 18 formed on the surface of the metal layer 14b. The plated layer 18 is formed along the sealing portion 14. Thus, the sealing portion 14 of the fifth embodiment is thinner than the sealing portion 14 in the first through fourth embodiments. Thus, the height of the electronic component 500 can be reduced. As with the first embodiment, the electronic component 500 can be downsized and reduced in height, positional misalignment can be reduced, and damage can be suppressed.

The sealing portion 14 may have a single layer structure, or a laminated structure stacking three or more layers. The sealing portion 14 preferably includes a metal. This is because the plated layer 18 can be formed by electrolytic barrel plating. The plated layer 18 may fail to contact with the terminal 10b. To enhance the function of the plated layer 18 and the metal layer 14b as a shield, the plated layer 18 preferably contacts with the terminal 10b. The fifth embodiment may be combined with the second or third embodiment. This simplifies the fabrication process. The fifth embodiment may be combined with the fourth embodiment. That is to say, the sealing portion 14 made of an insulating material is formed along the device chip 12, and the plated layer 18 is formed by electroless barrel plating and electrolytic barrel plating.

The device chip 12 may be an acoustic wave filter chip including an acoustic wave filter such as a boundary acoustic wave filter or piezoelectric thin film resonator filter instead of the SAW filter, or a chip other than the acoustic wave filter chip. The device chip 12 may be mounted on the insulative substrate 10 by a method other than flip-chip mounting.

Sixth Embodiment

Figure 15A:
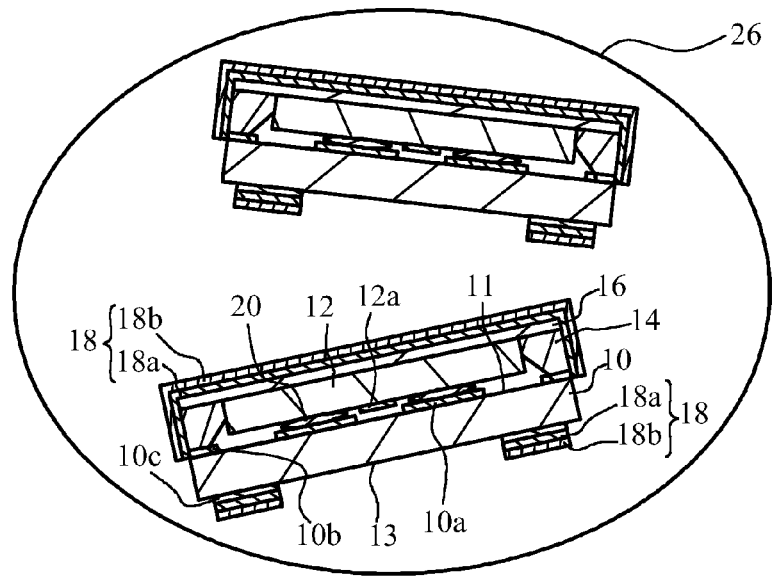
FIG. 15A is a cross sectional view illustrating a method of fabricating an electronic component in accordance with a sixth embodiment.
Figure 15B:
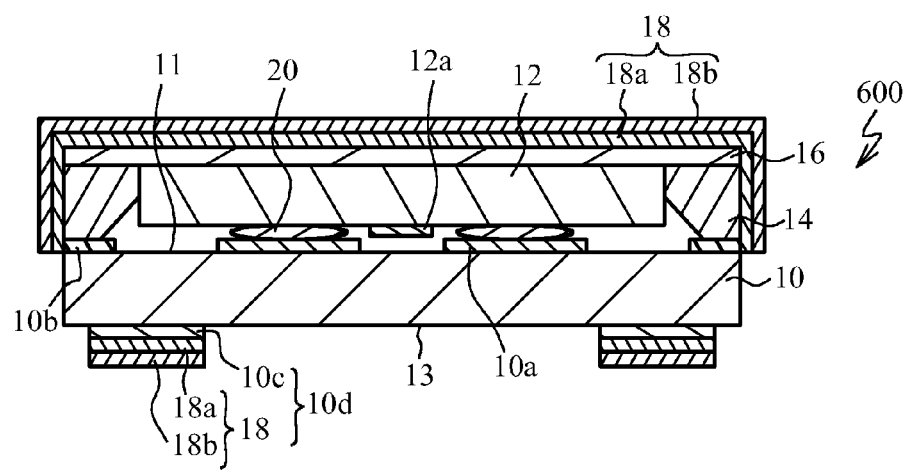
FIG. 15B is a cross-sectional view illustrating the electronic component.

A sixth embodiment forms the Ni layer 18a by electroless plating, and forms the Au layer 18b by electrolytic plating. FIG. 15A is a cross-sectional view illustrating a method of fabricating an electronic component 600 in accordance with the sixth embodiment. FIG. 15B is a cross-sectional view illustrating the electronic component 600. As with the second embodiment, the sixth embodiment performs full dicing illustrated in FIG. 6A.

As illustrated in FIG. 15A, the Ni layer 18a is formed on the terminals 10c and the sealing portion 14 by electroless barrel plating. After the Ni layer 18a is formed, the Au layer 18b is formed by electrolytic barrel plating illustrated in FIG. 6B. The above described process forms the electronic component 600 illustrated in FIG. 15B.

Seventh Embodiment

Figure 16A:
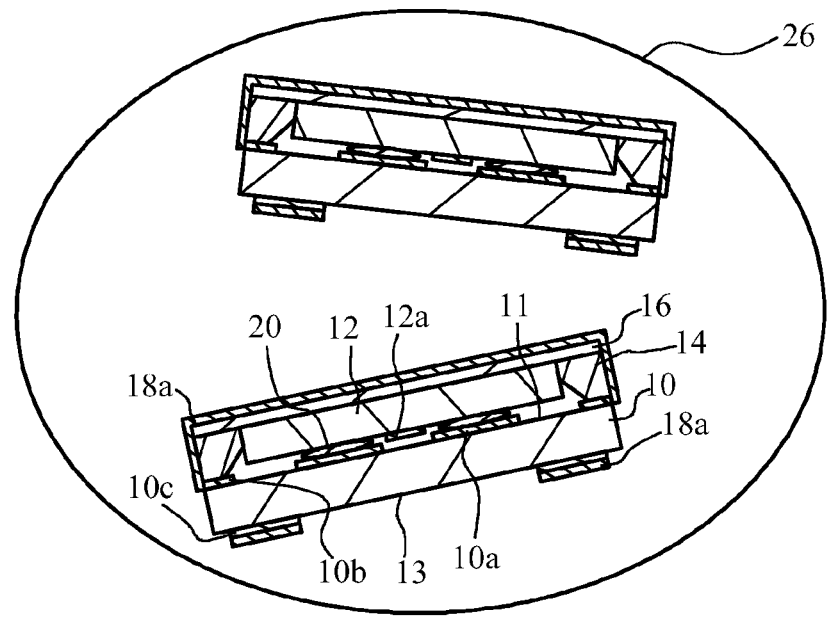
FIG. 16A and FIG. 16B are cross-sectional views illustrating an electronic component in accordance with a seventh embodiment.
Figure 16B:
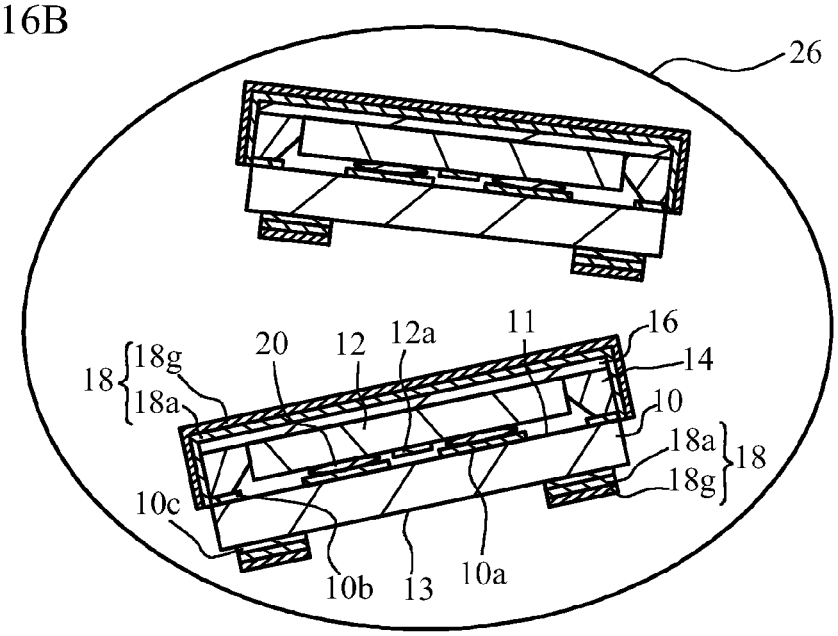
Figure 17:
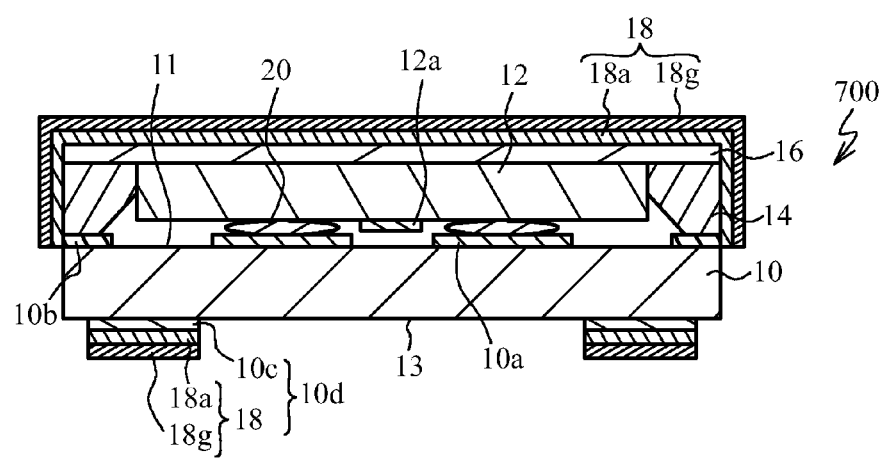
FIG. 17 is a cross-sectional view illustrating the electronic component.

A seventh embodiment forms a Cu layer 18g (fifth and sixth plated layers) on the terminals 10c and the sealing portion 14. FIG. 16A and FIG. 16B are cross-sectional views illustrating a method of fabricating an electronic component 700 in accordance with the seventh embodiment. FIG. 17 is a cross-sectional view illustrating the electronic component 700. As with the second embodiment, the seventh embodiment performs full dicing illustrated in FIG. 6A.

As illustrated in FIG. 16A, the Ni layer 18a is formed on the terminals 10c and the sealing portion 14 by barrel plating. The Ni layer 18a may be formed by any of electrolytic barrel plating and electroless barrel plating. As illustrated in FIG. 16B, after the Ni layer 18a is formed, the Cu layer 18g covering the surface of the Ni layer 18a is formed by electrolytic barrel plating. That is to say, the surface of the terminal 10d is made of Cu. The above described process forms the electronic component 700 illustrated in FIG. 17.

Eighth Embodiment

An eighth embodiment forms a Cu layer 18h (seventh plated layer) on the terminals 10c. FIG. 18A through FIG. 19A are cross-sectional views illustrating a method of fabricating an electronic component 800 in accordance with the eighth embodiment. FIG. 19B is a cross-sectional view illustrating the electronic component 800. The device chip 12 is sealed as illustrated in FIG. 1B.

Figure 18A:
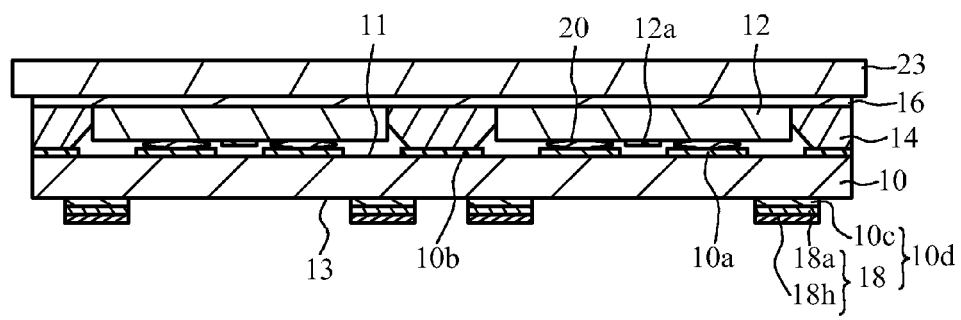
FIG. 18A through FIG. 18C are cross-sectionals views illustrating a method of fabricating an electronic component in accordance with an eighth embodiment.
Figure 18B:
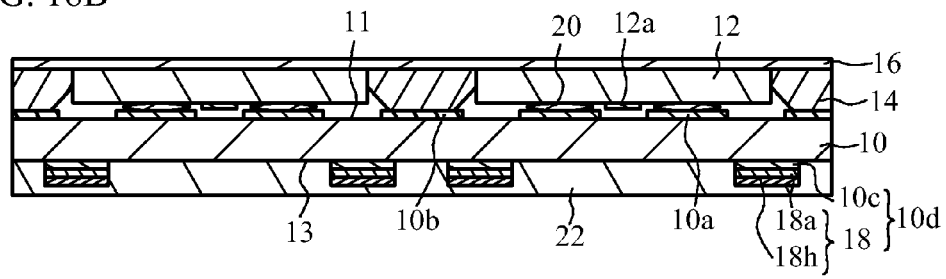
Figure 18C:
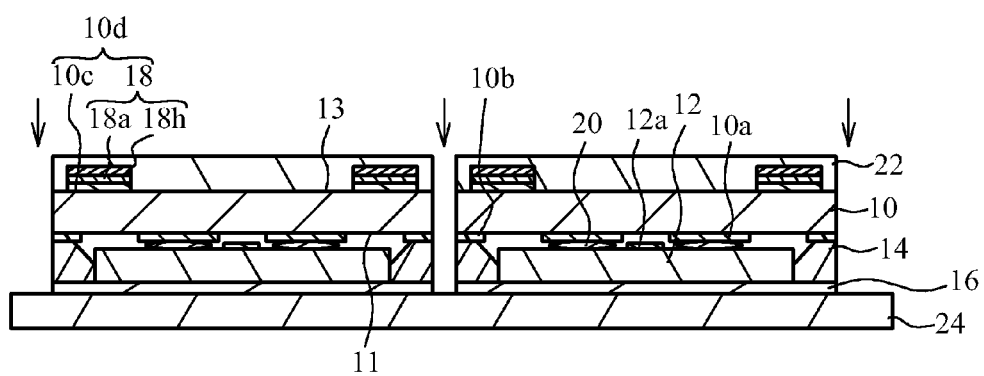

As illustrated in FIG. 18A, a resist layer 23 is formed on the upper surface of the sealing portion 14. After the resist layer 23 is formed, the Ni layer 18a is formed on the terminals 10c and the Cu layer 18h is formed on the surface of the Ni layer 18a by electrolytic plating. As illustrated in FIG. 18B, the resist layer 23 is removed. The resist layer 22 is formed on the whole of the bottom surface 13 of the insulative substrate 10. The resist layer 22 covers the terminals 10c, the Ni layer 18a, and the Cu layer 18h. Full dicing is performed as illustrated in FIG. 18C.

Figure 19A:
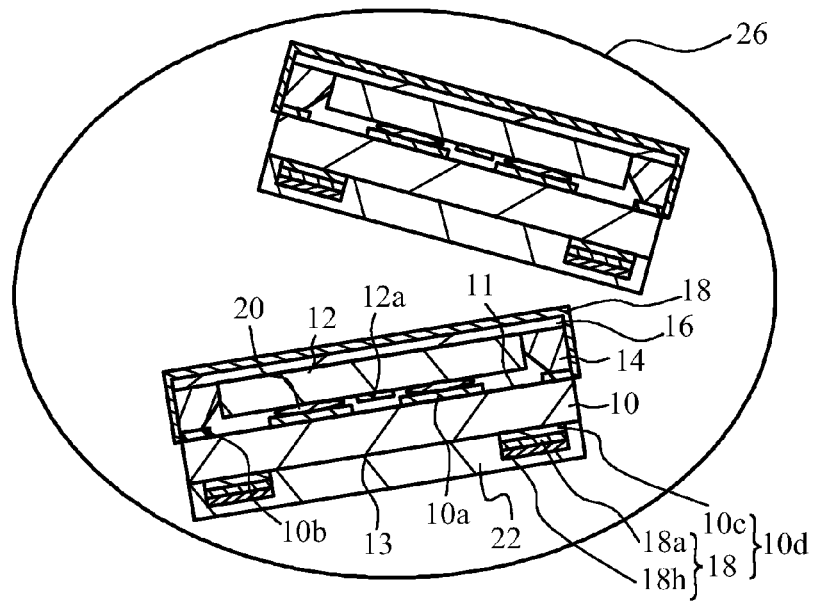
FIG. 19A is a cross-sectional view illustrating a method of fabricating an electronic component in accordance with an eighth embodiment.
Figure 19B:
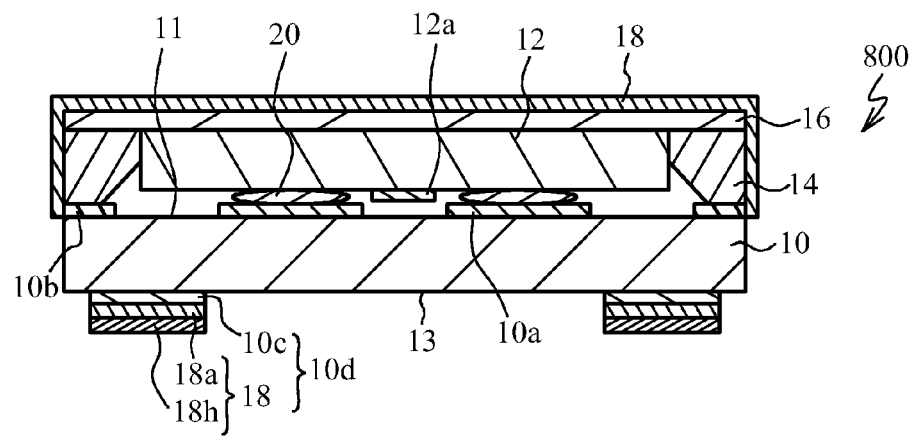
FIG. 19B is a cross-sectional view illustrating the electronic component.

As illustrated in FIG. 19A, the plated layer 18 is formed on the surface of the sealing portion 14 by electrolytic barrel plating. The resist layer 22 is removed. The above described process forms the electronic component 800.

An electronic component is sometimes embedded in a multilayered substrate. When the surface of the terminal 10d is a Cu layer as described for the electronic components 700 and 800, the reliability of the electrical connection between the electronic component and the multilayered substrate is improved.

Figure 20:
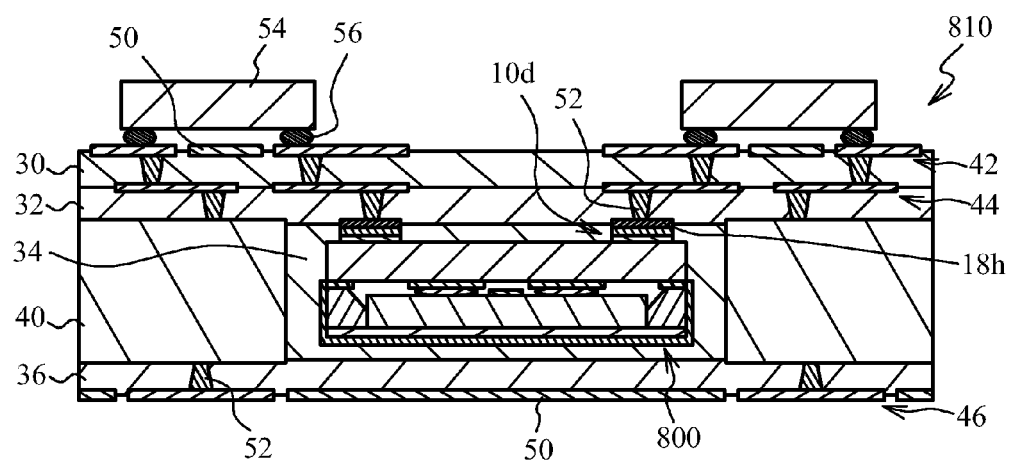
FIG. 20 is a cross-sectional view illustrating a multilayered substrate.

FIG. 20 is a cross-sectional view illustrating a multilayered substrate 810. As illustrated in FIG. 20, insulating layers 30, 32, 34, and 36 are stacked in this order from the upper side. A core 40 is located in the same layer as the insulating layer 34. A conductive layer 42 and a solder resist 50 are located on the upper surface of the insulating layer 30, and a conductive layer 44 is located between the insulating layer 30 and the insulating layer 32. A conductive layer 46 and the solder resist 50 are located on the bottom surface of the insulating layer 34. The conductive layers are coupled to each other by via wiring 52 piercing through the insulating layer in the vertical direction. The core 40 is coupled to the conductive layers 44 and 46 through the via wiring 52. The conductive layers, the core 40, and the via wiring 52 are made of a metal such as Cu. The insulating layers are resin layers made of an epoxy resin for example.

The electronic component 800 is embedded in the insulating layer 34. The core 40 is located outside the insulating layer 34. The terminal 10d of the electronic component 800 is coupled to the conductive layer 44 through the via wiring 52. Two chip components 54 are flip-chip mounted on the upper surface of the multilayered substrate 810. The chip components 54 are coupled to the conductive layer 42 through solder balls 56, and are electrically coupled to the electronic component 800. The chip components 54 are passive elements such as a resistor, a chip inductor, or a chip conductor, or active elements such as an IC (Integrated Circuit).

Both the Cu layer 18h of the terminal 10d and the via wiring 52 are formed of Cu. Thus, the reliability of the electrical connection between the terminal 10d and the via wiring 52 improves. In addition, the core 40, the via wiring 52, and the conductive layers are made of a metal, and function as a path for releasing heat generated in the electronic component 800. Therefore, high heat release performance can be ensured. Moreover, the core 40 is thicker than the insulating layers 30, 32, and 36, and is formed of a metal. Therefore, the strength of the multilayered substrate 810 is enhanced.

The solder resist 50 prevents the solder of the solder ball 56 and the solder bonded to a part of the conductive layer 46 to mount the multilayered substrate 810 on to an external device from adhering to other parts of the conductive layers 42 and 46. The electronic components 100 through 700 may be embedded in the multilayered substrate 810. Especially, when the electronic components 700 and 800 with the terminal 10d including a Cu layer are embedded, a good electrical connection can be obtained.

Ninth Embodiment

Figure 21:
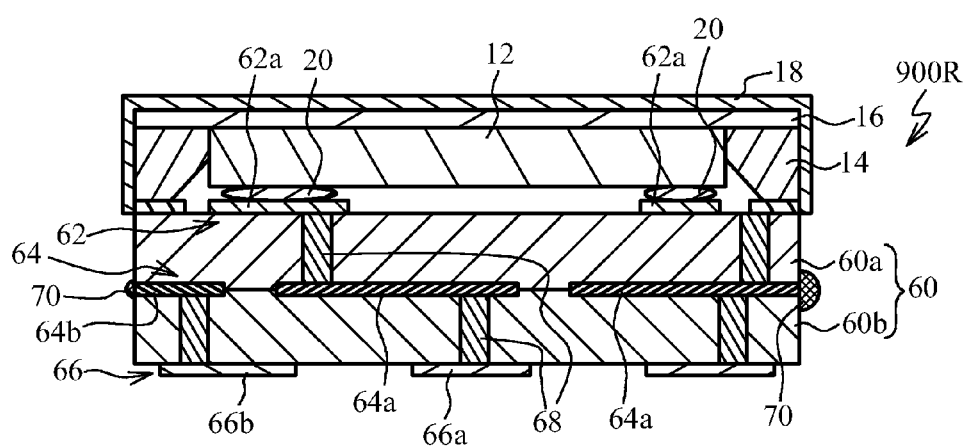
FIG. 21 is a cross-sectional view illustrating an electronic component in accordance with a second comparative example.

A ninth embodiment mounts the device chip 12 on a multilayered substrate. A description will first be given of a second comparative example. FIG. 21 is a cross-sectional view illustrating an electronic component 900R of the second comparative example, and corresponds to the cross-section taken along line C-C in FIG. 22A through FIG. 22C described later.

As illustrated in FIG. 21, an insulative substrate 60 is a multilayered substrate, and includes insulating layers 60a and 60b stacking in this order from the upper side. A conductive layer 62 is formed on the upper surface of the insulating layer 60a. A conductive layer 64 is located between the insulating layers 60a and 60b. A conductive layer 66 is formed on the bottom surface of the insulating layer 60b. The device chip 12 is electrically coupled to the conductive layer 62. The conductive layer 64 functions as internal wiring. The conductive layer 66 functions as a foot pad. The conductive layers are coupled to each other by via wiring 68.

Figure 22A:
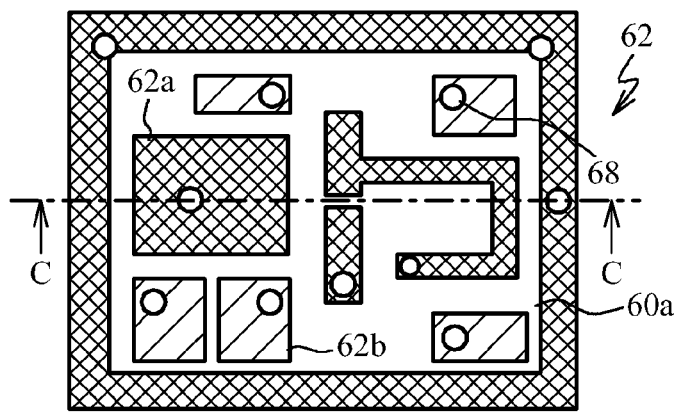
FIG. 22A through FIG. 22C are plan views illustrating conductive layers.
Figure 22B:
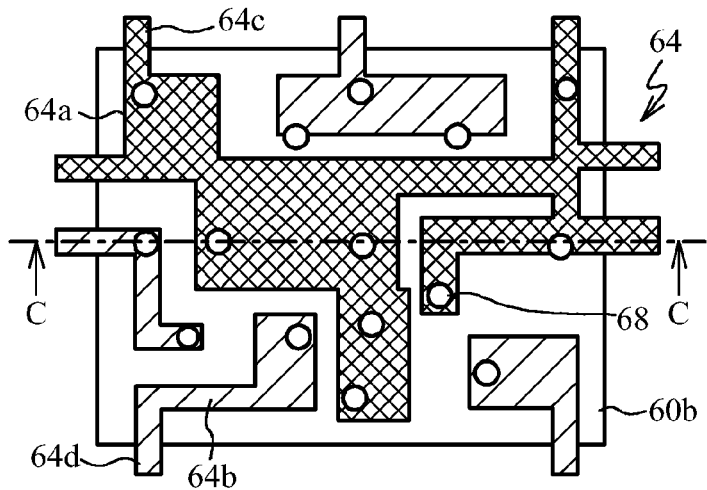
Figure 22C:
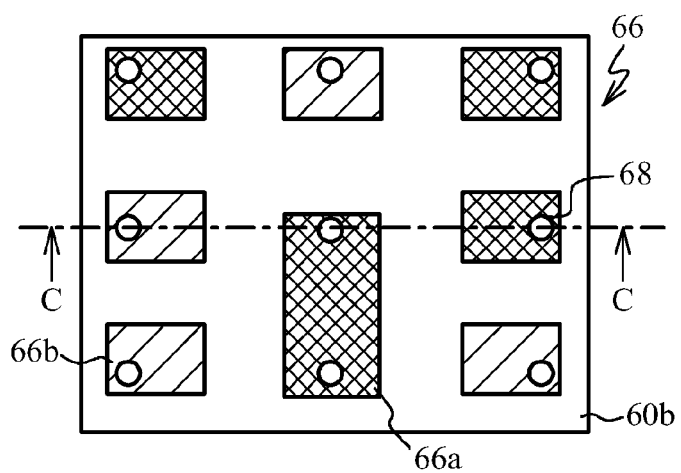
Figure 24A:
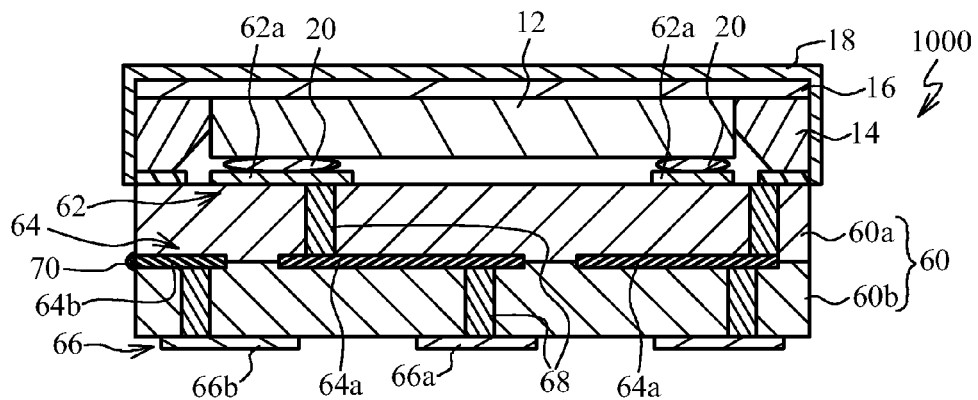
FIG. 24A is a cross-sectional view illustrating an electronic component in accordance with a tenth embodiment.
Figure 24B:
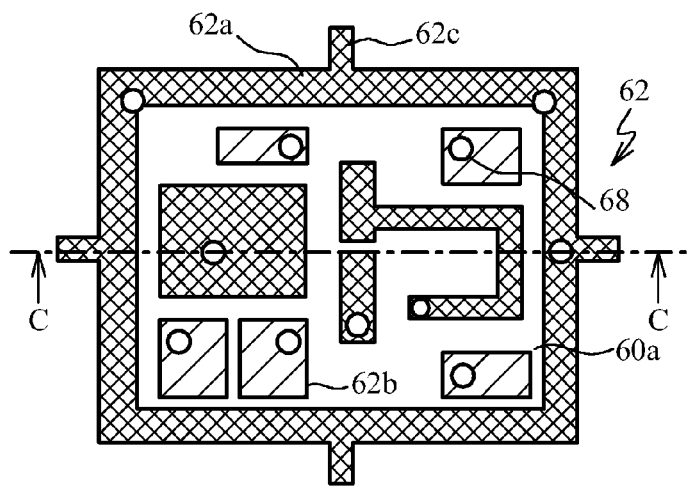
FIG. 24B and FIG. 24C are cross-sectional views illustrating conductive layers.
Figure 24C:
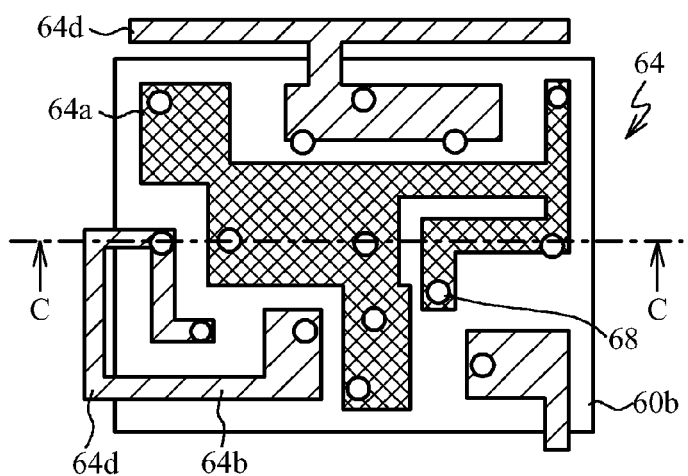

FIG. 22A is a plan view illustrating the conductive layer 62. FIG. 22B is a plan view illustrating the conductive layer 64. FIG. 22C is a plan view illustrating the conductive layer 66. Ground terminals and grounding wiring are indicated by cross hatching. Signal terminals and signal wiring are indicated by hatching. The via wiring 68 is indicated with an outlined circle. FIG. 22B, and FIG. 24B and FIG. 24C described later illustrate a state where electrical supply lines are not removed.

As illustrated in FIG. 22A, the conductive layer 62 includes a ground terminal 62a and a signal terminal 62b. As illustrated in FIG. 22B, the conductive layer 64 includes grounding wiring 64a and signal wiring 64b. As illustrated in FIG. 22C, the conductive layer 66 includes a ground terminal 66a and a signal terminal 66b. The ground terminal 62a is coupled to the grounding wiring 64a, and the grounding wiring 64a is coupled to the ground terminal 66a. The signal terminal 62b is coupled to the signal wiring 64b, and the signal wiring 64b is coupled to the signal terminal 66b.

In a substrate before dicing, the conductive layers 62, 64, and 66 are formed by electrolytic plating. The grounding wiring 64a is coupled to an electrical supply line 64c. The signal wiring 64b is coupled to an electrical supply line 64d. The electrical supply lines 64c and 64d protrude outside the insulative substrate 60. Electrolytic plating for forming the conductive layers is performed by supplying the current to the electrical supply lines 64c and 64d.

The electronic component 900R is formed through the process illustrated in FIG. 2A through FIG. 3A. The electrical supply lines 64c and 64d are removed during the dicing illustrated in FIG. 2B. The grounding wiring 64a and the signal wiring 64b are exposed from the side surface of the insulative substrate 60. For example, the grounding wiring 64a and the signal wiring 64b are electrolytic plated during the electrolytic barrel plating illustrated in FIG. 2C. Thereby, a Ni layer 70 is formed in exposed parts of the grounding wiring 64a and the signal wiring 64b as illustrated in FIG. 21. The Ni layer 70 of large size is formed in the grounding wiring 64a. The Ni layer 70 of minute size is formed in the signal wiring 64b. The grounding wiring 64a is electrically coupled to the sealing portion 14 and the lid 16 through the ground terminal 62a. The sealing portion 14 and the lid 16 have large areas, and thus large current flows therethrough. Thus, large current also flows through the grounding wiring 64a, and the Ni layer 70 becomes large. The Ni layer 70 causes a short circuit, and interrupts handling.

Figure 23A:
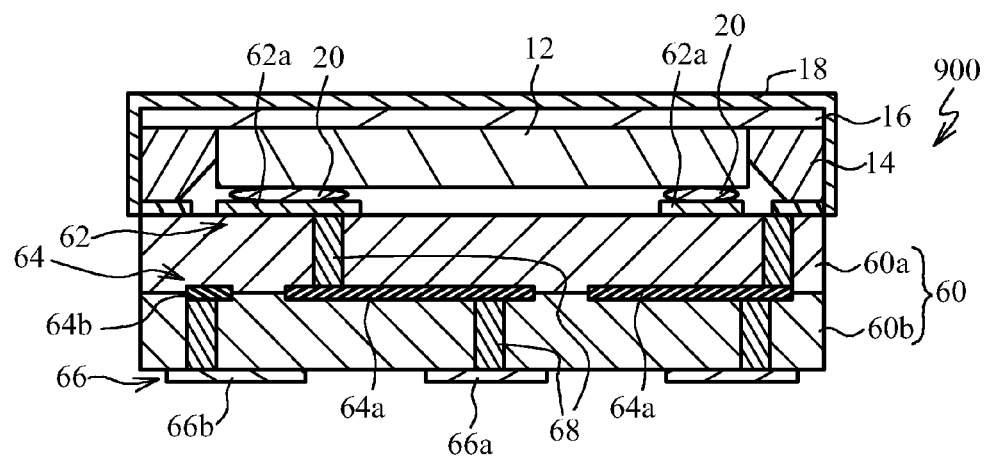
FIG. 23A is a cross-sectional view illustrating an electronic component in accordance with a ninth embodiment.
Figure 23B:
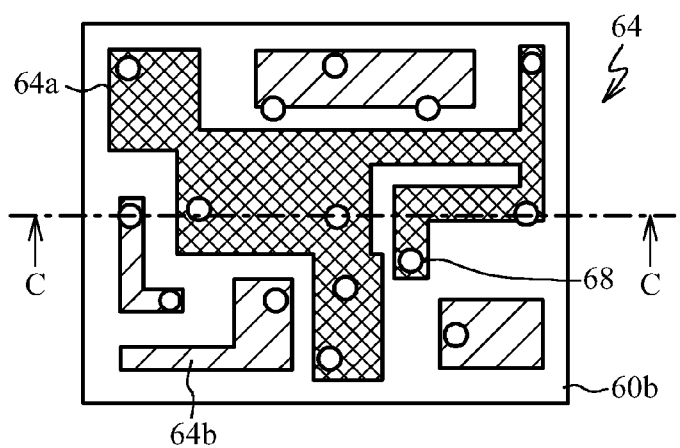
FIG. 23B is a plan view illustrating a conductive layer.

A description will now be given of a ninth embodiment. FIG. 23A is a cross-sectional view illustrating an electronic component 900 in accordance with the ninth embodiment. FIG. 23B is a plan view illustrating the conductive layer 64. The conductive layers 62 and 64 are illustrated in FIG. 22A and FIG. 22C, and thus the illustration thereof is omitted.

As illustrated in FIG. 23A and FIG. 23B, the electrical supply lines 64c and 64d are not located. The conductive layers 62, 64, and 66 are formed by electroless plating, and accordingly, electrical supply lines are not necessary. Thus, the grounding wiring 64a and the signal wiring 64b are not exposed from the side surface of the insulative substrate 60 after dicing. Therefore, the formation of the Ni layer 70 is suppressed. A short circuit due to the Ni layer 70 is suppressed, and the handling can be smooth.

Tenth Embodiment

A tenth embodiment describes a case where the grounding wiring 64a is not exposed. FIG. 24A is a cross-sectional view illustrating an electronic component 1000 in accordance with the tenth embodiment. FIG. 24B is a plan view illustrating the conductive layer 62. FIG. 24C is a cross-sectional view illustrating the conductive layer 64.

As illustrated in FIG. 24B, an electrical supply line 62c is electrically coupled to the ground terminal 62a located at an outer periphery of the insulating layer 60a in the ground terminals 62a. As illustrated in FIG. 24C, an electrical supply line is not coupled to the grounding wiring 64a. The electrical supply line 64d is coupled to the signal wiring 64b. The electrical supply line 64d is arranged so as not to overlap the insulative substrate 60 in the thickness direction. The conductive layer 62, 64, and 66 are formed by electrolytic plating with the electrical supply lines 62c and 64d.

The electrical supply lines 62c and 64d are removed during the dicing illustrated in FIG. 2B. The grounding wiring 64a is not exposed from the insulative substrate 60, and thereby, the Ni layer 70 is not formed in the grounding wiring 64a. The signal wiring 64b is exposed from the side surface of the insulative substrate 60. Thus, the Ni layer 70 of minute size is formed in the signal wiring 64b as illustrated in FIG. 24A. However, the Ni layer 70 is small, and thus a short circuit and a handling problem hardly occur. The electrical supply line 64*d* is not arranged in the insulative substrate 60. Therefore, capacitance coupling between the electrical supply line 64*d* and the signal wiring and grounding wiring is suppressed. Characteristic degradation of the electronic component 1000 due to the capacitance coupling is also suppressed.

Although the embodiments of the present invention have been described in detail, it is to be understood that the various change, substitutions, and alterations could be made hereto without departing from the spirit and scope of the invention.

What is claimed is:

1. A method of fabricating an electronic component, the method comprising:
    mounting a device chip on an upper surface of an insulative substrate;
    forming a sealing portion that seals the device chip;
    cutting the insulative substrate and the sealing portion; and
    forming a plated layer covering the sealing portion by barrel plating,
    wherein the sealing portion is formed of an insulating material, and
    the forming of the plated layer includes forming a first plated layer on a surface of the sealing portion by electroless barrel plating and then forming a second plated layer on a surface of the first plated layer by electrolytic barrel plating.

2. The method according to claim 1, further comprising:
    forming a resist layer covering a terminal located on a bottom surface of the insulative substrate before the forming of the plated layer; and
    removing the resist layer after the forming of the plated layer.

3. The method according to claim 1, wherein
    the forming of the sealing portion includes forming the sealing portion along a side surface and an upper surface of the device chip.

4. A method of fabricating an electronic component, the method comprising:
    mounting a device chip on an upper surface of an insulative substrate:
    forming a sealing portion that seals the device chip;
    cutting the insulative substrate and the sealing portion; and
    forming a plated layer covering the sealing portion by barrel plating, wherein
    a terminal is located on a bottom surface of the insulative substrate that is an opposite surface to the upper surface of the insulative substrate, and
    the cutting includes cutting the insulative substrate and the sealing portion from a side of the bottom surface of the insulative substrate.

5. The method according to claim 4, wherein
    the sealing portion includes a metal, and
    the forming of the plated layer includes forming the plated layer by electrolytic barrel plating.

6. The method according to claim 5, wherein
    the plated layer includes a material same as that of the terminal located on the bottom surface of the insulative substrate.

7. The method according to claim 5, wherein
    the forming of the plated layer includes forming a first plated layer covering the sealing portion and a second plated layer contacting with the terminal located on the bottom surface of the insulative substrate, and
    the method further comprises removing the second plated layer so that the terminal is exposed after the forming of the plated layer.

8. The method according to claim 4, wherein
    the forming of the plated layer includes forming a first plated layer covering the sealing portion and a second plated layer covering the terminal located on the bottom surface of the insulative substrate, and
    the first plated layer and the second plated layer are formed of copper.

9. The method according to claim 4, further comprising:
    forming a first plated layer formed of copper on the terminal located on the bottom surface of the insulative substrate;
    forming a resist layer covering the first plated layer before the forming of the plated layer; and
    removing the resist layer after the forming of the plated layer.

10. The method according to claim 4, wherein
    the insulative substrate includes internal wiring,
    the forming of the plated layer includes forming the plated layer by electrolytic barrel plating under a state where a grounding wiring out of the internal wiring is not exposed from the insulative substrate.

11. The method according to claim 10, wherein
    the forming of the plated layer is performed under a state where a grounding wiring and a signal wiring out of the internal wiring are not exposed from the insulative substrate.

12. The method according to claim 4, further comprising:
    forming a resist layer covering the terminal located on the bottom surface of the insulative substrate before the forming of the plated layer; and
    removing the resist layer after the forming of the plated layer.

13. The method according to claim 4, wherein
    the forming of the sealing portion includes forming the sealing portion along a side surface and an upper surface of the device chip.

* * * * *